US006187603B1

(12) United States Patent
Haven et al.

(10) Patent No.: US 6,187,603 B1
(45) Date of Patent: Feb. 13, 2001

(54) FABRICATION OF GATED ELECTRON-EMITTING DEVICES UTILIZING DISTRIBUTED PARTICLES TO DEFINE GATE OPENINGS, TYPICALLY IN COMBINATION WITH LIFT-OFF OF EXCESS EMITTER MATERIAL

(75) Inventors: Duane A. Haven, Cupertino; N. Johan Knall, Palo Alto; Paul N. Ludwig, Livermore; John M. Macaulay, Palo Alto, all of CA (US)

(73) Assignee: Candescent Technologies Corporation, San Jose, CA (US)

( * ) Notice: Under 35 U.S.C. 154(b), the term of this patent shall be extended for 0 days.

(21) Appl. No.: 08/660,536

(22) Filed: Jun. 7, 1996

(51) Int. Cl.[7] ...................................................... H01L 21/00
(52) U.S. Cl. ................................................ 438/20; 216/23
(58) Field of Search ................................ 216/13, 23, 24, 216/25; 438/20

(56) References Cited

U.S. PATENT DOCUMENTS

| | | | |
|---|---|---|---|
| 3,497,929 | 3/1970 | Shoulders | 445/52 |
| 3,595,762 | 7/1971 | Chessin | 204/38 R |
| 3,665,241 | 5/1972 | Spindt et al. | 313/351 |
| 3,755,704 | 8/1973 | Spindt et al. | 313/309 |
| 3,970,887 | 7/1976 | Smith et al. | 313/309 |
| 3,998,678 | 12/1976 | Fukase et al. | 216/11 |
| 4,008,412 | 2/1977 | Yuito et al. | 313/309 |
| 4,407,695 | 10/1983 | Deckman et al. | 156/643 |
| 4,940,916 | 7/1990 | Borel et al. | 313/306 |
| 5,007,873 | 4/1991 | Goronkin et al. | 445/49 |
| 5,053,673 | 10/1991 | Tomii et al. | 313/308 |
| 5,150,019 | 9/1992 | Thomas et al. | 315/350 |
| 5,150,192 | 9/1992 | Greene et al. | 313/336 |
| 5,151,061 | 9/1992 | Sandhu | 445/24 |
| 5,164,632 | 11/1992 | Yoshida et al. | 313/309 |
| 5,170,092 | 12/1992 | Tomii et al. | 313/310 |
| 5,194,780 | 3/1993 | Meyer | 315/169.3 |

(List continued on next page.)

FOREIGN PATENT DOCUMENTS

| | | | |
|---|---|---|---|
| 0 416 625 A2 | 3/1991 | (EP) . | |
| 0 508 737 A1 | 10/1992 | (EP) . | |
| 0 707 237 * | 4/1996 | (EP) | G03F/7/20 |
| EP0707 237 A1 | 4/1996 | (EP) | G03F/7/20 |
| WO 97/47020 | 12/1997 | (WO) | H01J/1/30 |

OTHER PUBLICATIONS

Betsui, "Fabrication and Characteristics of Si Field Emitter Arrays," *Tech. Dig. IVMC 91*, 1991, pp. 26–29.

(List continued on next page.)

*Primary Examiner*—Jeffrie R Lund
*Assistant Examiner*—Alva C. Powell
(74) *Attorney, Agent, or Firm*—Skjerven Morrill MacPherson LLP; Ronald J. Meetin

(57) ABSTRACT

An electron-emitting device is fabricated by a process in which particles (46) are distributed over an initial structure. The particles are utilized in defining primary openings (52, 64, or 78) that extend through a primary layer (50A, 62A, or 72) provided over a gate layer (48A, 60A, or 60B) formed over an insulating layer (44) and in defining corresponding gate openings (54, 66, or 80) that extend through the gate layer. The insulating layer is etched through the primary and gate openings to form corresponding dielectric openings (56 or 68) through the insulating layer down to a lower non-insulating region (42). Electron-emissive elements (58A or 70A) are formed over the lower non-insulating region so that each electron-emissive element is at least partially situated in one dielectric opening. Formation of the electron-emissive elements, typically in the shape of cones, normally entails depositing emitter material over the primary layer, through the primary and gate openings, and into the dielectric openings and then removing the primary layer so as to remove any emitter material accumulated over the primary layer.

38 Claims, 13 Drawing Sheets

U.S. PATENT DOCUMENTS

| | | | | |
|---|---|---|---|---|
| 5,234,541 | * | 8/1993 | Shannon et al. | 156/651 |
| 5,249,340 | | 10/1993 | Kane et al. | 445/50 |
| 5,277,638 | | 1/1994 | Lee | 445/24 |
| 5,278,472 | | 1/1994 | Smith et al. | 313/309 |
| 5,316,511 | | 5/1994 | Lee | 445/24 |
| 5,378,182 | | 1/1995 | Liu | 445/24 |
| 5,411,630 | | 5/1995 | Nagase et al. | 216/22 |
| 5,458,520 | | 10/1995 | DeMercurio et al. | 445/24 |
| 5,462,467 | | 10/1995 | Macaulay et al. | 445/50 |
| 5,466,626 | | 11/1995 | Armacost et al. | 437/60 |
| 5,474,651 | | 12/1995 | Huebner | 156/644 |
| 5,504,385 | | 4/1996 | Jin et al. | 313/310 |
| 5,509,840 | | 4/1996 | Huang et al. | 445/24 |
| 5,517,075 | | 5/1996 | Vickers | 313/336 |
| 5,534,743 | | 7/1996 | Jones et al. | 313/309 |
| 5,559,389 | | 9/1996 | Spindt et al. | 313/310 |
| 5,562,516 | | 10/1996 | Spindt et al. | 445/24 |
| 5,564,959 | | 10/1996 | Spindt et al. | 445/24 |
| 5,578,185 | | 11/1996 | Macaulay et al. | 205/123 |
| 5,588,894 | | 12/1996 | Jin et al. | 445/24 |
| 5,608,283 | | 3/1997 | Twichell et al. | 313/309 |
| 5,669,800 | | 9/1997 | Ida et al. | 445/254 |
| 5,676,853 | | 10/1997 | Alwan | 216/11 |
| 5,698,934 | | 12/1997 | Jin et al. | 313/309 |
| 5,711,694 | | 1/1998 | Levine et al. | 445/24 |
| 5,808,401 | | 9/1998 | Jin et al. | 313/309 |

OTHER PUBLICATIONS

Busta, "Vacuum Microelectronics–1992," *J. Micromech. Microeng.*, vol. 2, 1992, pp. 43–74.

Cochran et al, "Low–voltage Field Emission from Tungsten Fiber Arrays in a Stabilized Zirconia Matrix," *J. Mater. Res.*, May/Jun. 1987, pp. 322–328.

Huang et al, "200–nm Gated Field Emitters," *IEEE Electron Device Letters*, Mar. 1993, pp. 121–122.

Spindt et al, "Physical Properties of Thin–film Field Emission Cathodes with Molybdenum Cones," *J. App. Phys.*, Dec. 1976, pp. 5248–5263.

Spindt et al, "Research in Micron–size Field–emission Tubes," *IEEE Conf. Record, 1966 Eighth Conf. Tube Techniques*, Sep. 20–22, 1966, pp. 143–147.

Sune et al, "Fabrication of Silicon–Column–Field Emitters for Microwave Applications," *Tech. Dig., 6th Int'l. Vac. Microelec. Conf.*, Jul. 12–15, 1993, pp. 15–16.

Williams et al, "Fabrication of 80 Å Metal Wires," *Rev. Sci. Instrum.*, Mar. 1984, pp. 410–412.

* cited by examiner

Fig. 4a
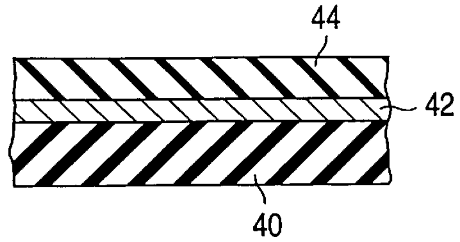
Fig. 4b
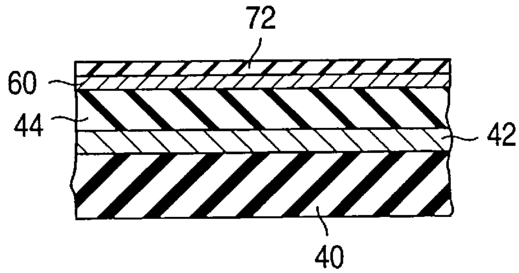
Fig. 4c
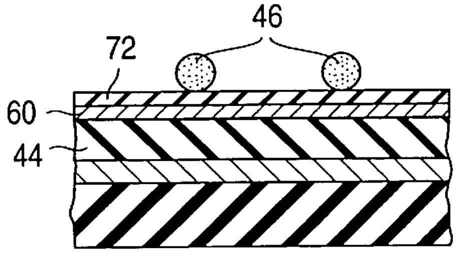
Fig. 4d
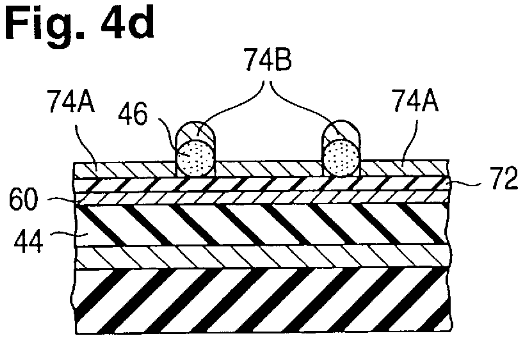
Fig. 4e
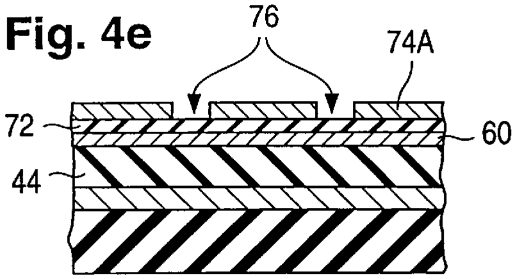
Fig. 4f
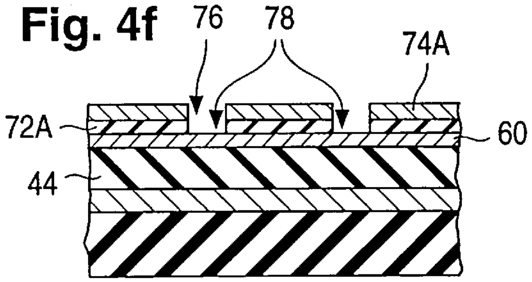
Fig. 4g1
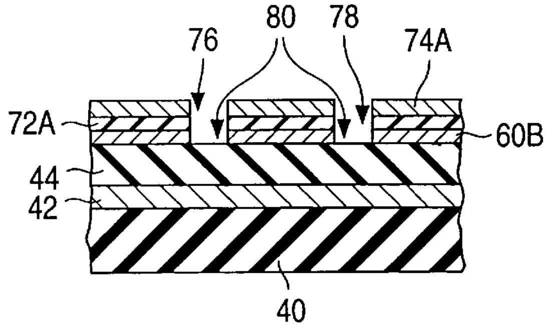
Fig. 4g2
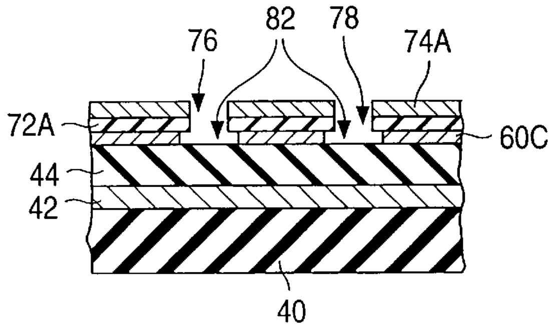

Fig. 15.1
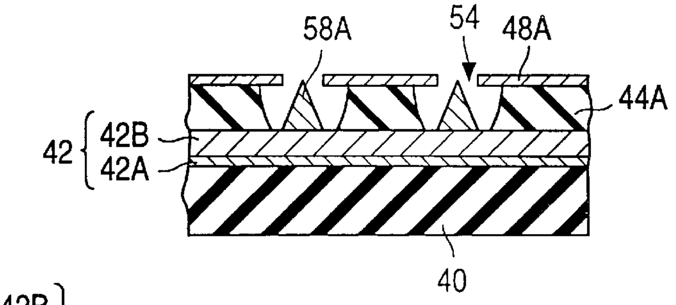
Fig. 14
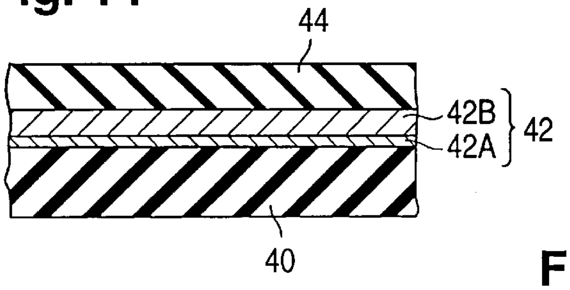
Fig. 15.2
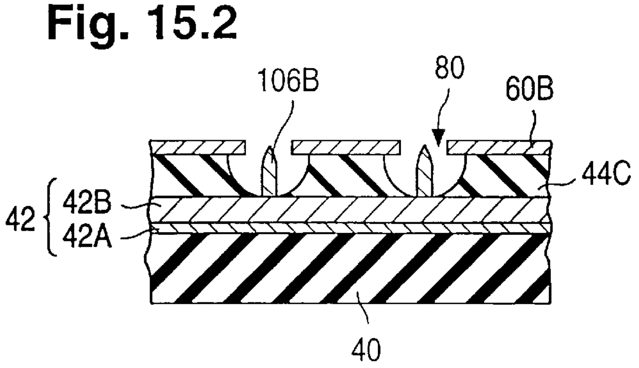
Fig. 16
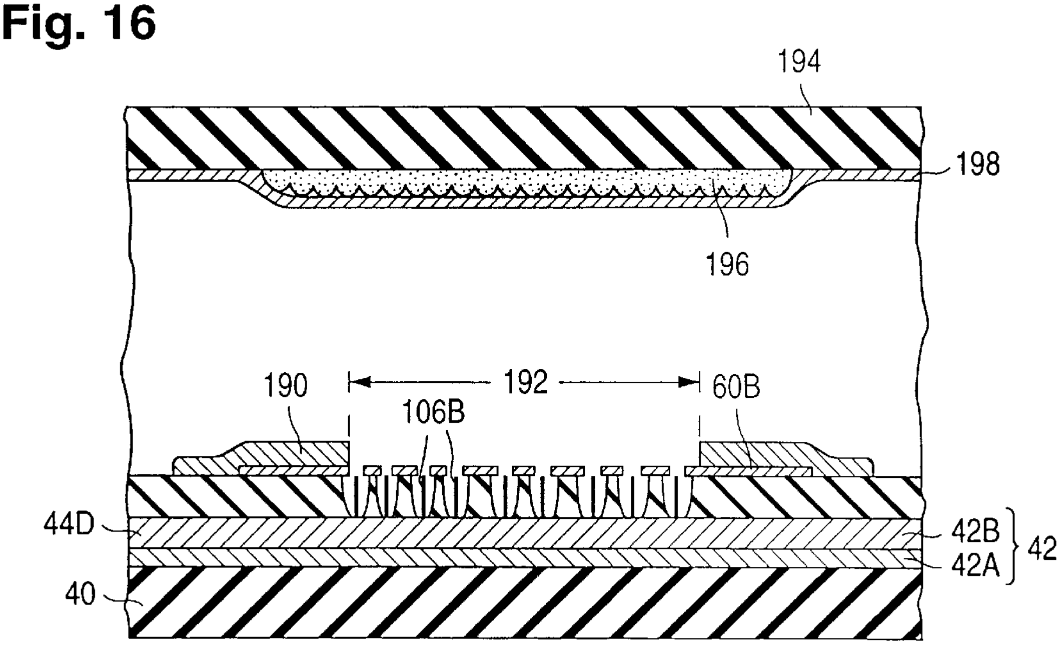

FABRICATION OF GATED ELECTRON-EMITTING DEVICES UTILIZING DISTRIBUTED PARTICLES TO DEFINE GATE OPENINGS, TYPICALLY IN COMBINATION WITH LIFT-OFF OF EXCESS EMITTER MATERIAL

CROSS REFERENCE TO RELATED APPLICATION

This contains similar subject matter to Ludwig et al, co-filed U.S. patent application Ser. No. 08/660,538. This also contains subject matter partially similar to Haven et al, co-filed U.S. patent application Ser. No. 08/660,537.

FIELD OF USE

This invention relates to the fabrication of electron-emitting devices, commonly referred to as cathodes, suitable for products such as cathode-ray tube ("CRT") displays of the flat-panel type.

BACKGROUND ART

A field-emission cathode (or field emitter) emits electrons upon being subjected to an electric field of sufficient strength. The electric field is produced by applying a suitable voltage between the cathode and an electrode, typically referred to as the anode or gate electrode, situated a short distance away from the cathode.

When a field-emission cathode is utilized in a flat-panel CRT display, electron emission from the cathode occurs across a sizable area. The electron-emitting area is commonly divided into a two-dimensional array of electron-emitting portions, each situated across from a corresponding light-emitting portion to form part or all of a picture element (pixel). The electrons emitted by each electron-emitting portion strike the corresponding light-emitting portion and cause it to emit visible light.

It is generally desirable that the illumination be uniform (constant) across the area of each light-emitting portion. One method for achieving uniform illumination is to arrange for electrons to be emitted uniformly across the area of the corresponding electron-emitting portion. This typically involves fabricating the electron-emitting portion as a large number of small, closely spaced electron-emissive elements.

Various techniques have been investigated for manufacturing electron-emitting devices that contain small, closely spaced electron-emissive elements. Spindt et al, "Research in Micron-Sized Field-Emission Tubes," *IEEE Conf. Rec.* 1966 *Eighth Conf. Tube Techniques*, Sep. 20, 1966, pp. 143–147, describes how small randomly distributed spherical particles are employed to define the locations for conical electron-emissive elements in a flat field-emission cathode. The size of the spherical particles strongly controls the base diameter of the conical electron-emissive elements.

FIGS. 1*a*–1*g* (collectively "FIG. 1") illustrate the sphere-based process utilized in Spindt et al to fabricate an electron-emitting diode having a thick anode. In FIG. 1*a*, the starting point is sapphire substrate 20. A sandwich consisting of lower molybdenum layer 22, insulating layer 24, and upper molybdenum layer 26 is situated on substrate 20.

Polystyrene spheres 28, one of which is shown in FIG. 1*b*, are scattered across the top of molybdenum layer 26. "Resist" is deposited to form resist layer 30A on the uncovered part of layer 26. See FIG. 1*c*. Portions 30B of the resist, typically alumina (aluminum oxide), accumulate on spherical particles 28 during the resist deposition. Spheres 28 are subsequently removed, thereby removing resist portions 30B. Referring to FIG. 1*d*, openings 32 extend through resist layer 30A at the locations of removed spheres 28.

The exposed portions of molybdenum layer 26 are etched through resist openings 32 to form openings 34 through molybdenum 26, the remainder of which is indicated as item 26A in FIG. 1*e*. Similarly, the 15 exposed parts of insulating layer 24 are etched through openings 34 to form cavities 36 through remaining insulating layer 24A. See FIG. 1*f*. Resist layer 30A is removed, typically during the cavity etch.

Finally, molybdenum is evaporatively deposited on top of the structure and into cavities 36. The evaporation is performed in such a way that the openings through which the molybdenum accumulates in cavities 36 progressively close. As indicated in FIG. 1*g*, conical molybdenum electron-emissive elements 38A are formed in cavities 36, while continuous molybdenum layer 38B is formed on top of molybdenum layer 26A. Layers 38B and 26A together form the anode for the diode.

Utilization of spherical particles to establish the locations, and base dimensions, of electron-emissive elements in Spindt et al is a creative approach to creating an electron-emitting device. However, the electrons emitted by elements 38A are collected by anode 26A/38B and thus are not utilized to directly activate light-emitting areas. It would be desirable to employ spherical particles to define the locations for small, closely spaced electron-emissive elements that emit electrons which can be utilized to directly activate light-emissive elements in a flat-panel device in a highly uniform manner.

GENERAL DISCLOSURE OF THE INVENTION

The present invention furnishes a set of fabrication processes in which particles, typically spherical, are so utilized in manufacturing gated electron-emitting devices. The particles define the locations, and to a large degree, the lateral areas of electron-emissive elements in the gated electron emitters. Importantly, the fabrication processes of the invention are arranged so that electrons emitted by the electron-emissive elements are available for directly activating elements such as light-emissive regions in a flat-panel device.

By appropriately adjusting the surface density and average size of the particles, the electron-emissive elements can be spaced suitably close together. Although the particles, and therefore the electron-emissive elements, are normally situated at largely random locations relative to one another, the number of electron-emissive elements per unit area is relatively uniform across the overall electron-emitting area. The surface density of the particles can readily be set at a high value. Since the particle surface density defines the surface density of the electron-emissive elements, a high surface density of electron-emissive elements can easily be attained.

Furthermore, the particles can readily be chosen to have a tight size distribution—i.e., the standard deviation in the average particle diameter is quite small. The electron-emissive elements, especially when they are conically shaped, therefore typically occupy largely equal lateral areas. By appropriately adjusting the values for certain dimensional parameters, such as certain thicknesses, the electron-emissive elements can be made to be quite similar to one another. The net result is that utilization of particles according to the manufacturing processes of the invention enables highly uniform electron emission to be achieved, thereby enabling light-emitting regions to be directly activated in a highly uniform manner.

In fabricating a gated electron emitter according to a principal aspect of the invention, a multiplicity of particles are distributed over a suitable starting structure. Importantly, the magnitude of the lateral area of the starting structure typically has little effect on the ability to distribute the particles in a relatively uniform (though largely random) manner over the starting structure. Consequently, the fabrication processes of the invention can readily be used to make electron emitters of large area.

After having been distributed over the starting structure, the particles are utilized to define corresponding locations (a) for a like multiplicity of primary openings extending through a primary layer provided over an electrically non-insulating gate layer formed over an electrically insulating layer in the structure and (b) for a like multiplicity of corresponding gate openings extending through the gate layer. As discussed below, "electrically non-insulating" means electrically conductive or electrically resistive. Each gate opening is vertically aligned to the corresponding primary opening. The primary layer typically consists of inorganic dielectric material.

The particles, preferably spherical in shape, can be distributed over the insulating layer, the gate layer, or the primary layer. Depending on which of these layers receives the particles, the particles are employed in various ways to define the gate openings.

When the particles are distributed over the insulating layer, electrically non-insulating gate material is typically provided over the insulating layer, at least in space between the particles. Suitable material referred to here as primary material is provided over the gate material, likewise at least in space between the particles. The particles are subsequently removed. During the particle removal operation, any gate material and/or primary material overlying the particles is simultaneously removed. The remaining primary material forms a primary layer through which the primary openings extend at the locations of the removed particles. The remaining gate material similarly forms the gate layer through which the gate openings extend at the locations of the removed particles.

When the particles are distributed over the gate layer, the primary material is provided over the gate layer, at least in space between the particles. The particles are removed, thereby simultaneously removing any primary material overlying the particles. The remaining primary material forms the primary layer through which the primary openings extend at the locations of the removed particles. The gate layer is subsequently etched through the primary openings to form the gate openings in the gate layer.

When the particles are distributed over the primary layer (which overlies the gate layer), further material is provided over the primary layer, at least in space between the particles. The particles are subsequently removed. During the particle removal, any of the further material overlying the particles is also removed. Apertures then extend through the remaining further material at the locations of the removed particles. The primary layer is etched through the apertures in the remaining further material to form the primary openings in the primary layer. Similarly, the gate layer is etched through the primary openings to form the gate openings in the gate layer.

Regardless of how the particles are utilized to define the openings in the primary and gate layers, the underlying insulating layer is etched through the primary and gate openings to form corresponding dielectric openings through the insulating layer down to a lower electrically non-insulating region provided below the insulating layer. Each primary opening is normally no larger than the corresponding gate opening. Consequently, the primary openings define the lateral dimensions of the (later-formed) electron-emissive elements. By choosing the particles to have a tight size distribution as is typically the case, the size distribution of the primary openings is, to a first approximation, equally tight.

Electrically non-insulating emitter material is deposited over the primary layer, through the primary and gate openings, and into the dielectric openings to form corresponding electron-emissive elements over the lower non-insulating region. The electron-emissive elements are typically shaped as cones. Since the primary openings typically have a tight size distribution, the lateral areas occupied by the electron-emissive elements are typically largely equal.

The primary layer is subsequently removed so as to lift-off excess emitter material accumulated on the primary layer. As a result, the movement of electrons emitted by the electron-emissive elements in an electron emitter fabricated according to the invention is not impeded by conductive material deposited over the insulating layer. The electrons can move beyond the electron emitter to activate elements, such as light-emitting regions, situated a suitable distance above the electron emitter. In short, the invention furnishes a set of economical processes for manufacturing high-performance electron emitters that can be readily incorporated into flat-panel CRT devices, especially large-area flat-panel CRT displays.

An important feature of the invention is that the candidates for the gate material in certain of the present fabrication processes include metals, such as gold, through which it is difficult to accurately etch small, typically sub-micrometer openings. In particular, when the gate material is deposited over the particles, gate openings are formed at the locations of the so-deposited particles during the gate material deposition. There is no need to perform an etch to form the gate openings. Consequently, the gate material can be a difficult-to-etch metal.

BRIEF DESCRIPTION OF THE DRAWINGS

FIGS. 4*a*–4*f*, 4*g*1, and 4*g*2 are cross-sectional structural views representing a set of front-end steps in a process for manufacturing a gated field emitter according to the invention. The front-end process sequence of FIGS. 4*a*–4*f* can be completed with the step of FIG. 4*g*1 or the step of FIG. 4*g*2. The field emitter can be provided with conical electron-emissive elements in accordance with the invention by applying the back-end steps of FIGS. 2*d*–2*g*, or the back-end steps of FIGS. 3*f*–3*h*, to the front-end steps of FIGS. 4*a*–4*f* and 4*g*1 or 4*g*2.

FIG. 14 is a cross-sectional structural view illustrating how the initial structure of FIG. 2a, 3a, 4a, 7a, or 12aappears when the lower non-insulating region consists of an electrically resistive portion and an electrically conductive portion.

FIGS. 15.1 and 15.2 are cross-sectional structural views illustrating how the final field-emission structures of FIGS. 2g and 5g appear when the lower non-insulating region consists of an electrically resistive portion and an electrically conductive portion.

FIG. 16 is a cross-sectional structural view of a flat-panel CRT display that incorporates a gated field emitter, such as that of FIG. 5g, fabricated according to the invention.

Like reference symbols are employed in the drawings and in the description of the preferred embodiments to represent the same, or very similar, item or items.

DESCRIPTION OF THE PREFERRED EMBODIMENTS

General Considerations

Figure 1A:
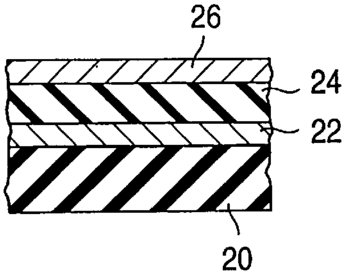
Fig. 1a PRIOR ART
FIGS. 1*a*–1*g* are cross-sectional structural views representing steps in a prior art process for manufacturing a diode field emitter.
Figure 1E:
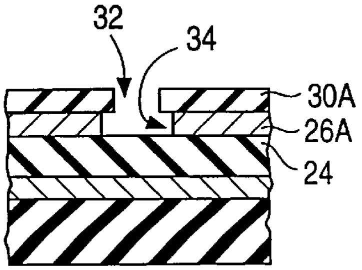
Fig. 1e PRIOR ART
Figure 1B:
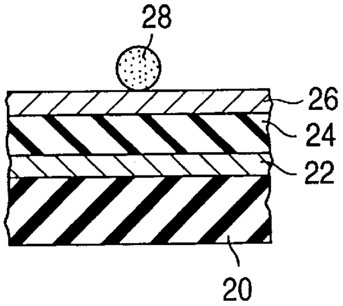
Fig. 1b PRIOR ART
Figure 1F:
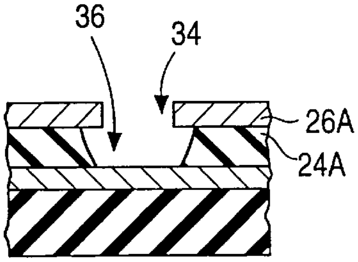
Fig. 1f PRIOR ART
Figure 1C:
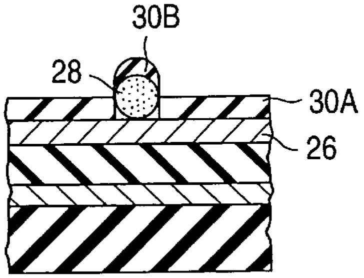
Fig. 1c PRIOR ART
Figure 1G:
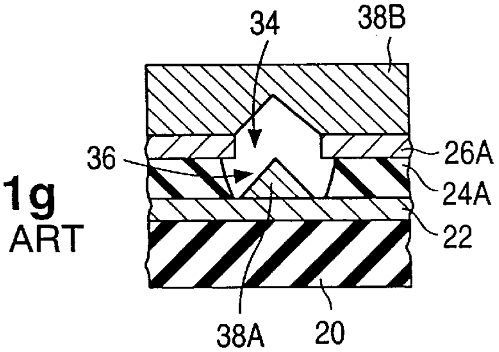
Fig. 1g PRIOR ART
Figure 1D:
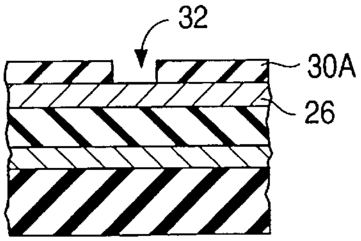
Fig. 1d PRIOR ART

The present invention utilizes particles distributed across a surface of a structure to define openings in a gate electrode for a gated field-emission cathode. Each field emitter fabricated according to the invention is suitable for exciting phosphor regions on a faceplate in a cathode-ray tube of a flat-panel device such as a flat-panel television or a flat-panel video monitor for a personal computer, a lap-top computer, or a workstation.

The invention furnishes a variety of different ways to utilize the particles, typically spherical, in defining the gate openings. The invention also furnishes a variety of ways for using the so-defined gate openings to produce electron-emissive elements of various shapes such as cones and filaments. Each electron-emissive element emits electrons through a corresponding one of the gate openings. Inasmuch as the particles define the locations of the gate openings, the particles also define the locations of the electron-emissive elements.

In some examples, the particles can be employed according to any one of several front-end process sequences to define gate openings in a partially finished structure that can be completed according to any one of several back-end process sequences to produce a gated field-emission cathode. The partially finished structure can often be used in creating either conical electron-emissive elements or filamentary electron-emissive elements. The invention thereby furnishes a mix-and-match capability in which any one of several front-end fabrication sequences can be combined with any one of several back-end fabrication sequences to create an efficient overall field-emitter manufacturing process that yields field emitters tailored to specific needs and particular choices of materials.

In the following description, the term "electrically insulating" (or "dielectric") generally applies to materials having a resistivity greater than $10^{10}$ ohm-cm. The term "electrically non-insulating" thus refers to materials having a resistivity below $10^{10}$ ohm-cm. Electrically non-insulating materials are divided into (a) electrically conductive materials for which the resistivity is less than 1 ohm-cm and (b) electrically resistive materials for which the resistivity is in the range of 1 ohm-cm to $10^{10}$ ohm-cm. These categories are determined at an electric field of no more than 1 volt/$\mu$m.

Examples of electrically conductive materials (or electrical conductors) are metals, metal-semiconductor compounds (such as metal silicides), and metal-semiconductor eutectics. Electrically conductive materials also include semiconductors doped (n-type or p-type) to a moderate or high level. Electrically resistive materials include intrinsic and lightly doped (n-type or p-type) semiconductors. Further examples of electrically resistive materials are (a) metal-insulator composites, such as cermet (ceramic with embedded metal particles), (b) forms of carbon such as graphite, amorphous carbon, and modified (e.g., doped or laser-modified) diamond, (c) and certain silicon-carbon compounds such as silicon-carbon-nitrogen.

Except as otherwise indicated, the following applies to anisotropic etches performed in the fabrication processes of the invention. All anisotropic etches are largely unidirectional and occur at the result of movement of ions in a direction substantially perpendicular to the upper surface of the emitter/gate interelectrode dielectric layer. Consequently, substantially no undercutting occurs during an anisotropic etch. All anisotropic etches are dry etches performed, for example, with a plasma or according to reactive-ion etching.

Fabrication of Field Emitters with Electron-Emissive Cones

Referring to the drawings, FIGS. 2*a*–2*g* (collectively "FIG. 2") illustrate a process for manufacturing a gated field-emission cathode utilizing spherical particles to define gate openings for conical electron-emissive elements according to the teachings of the invention. In the fabrication process of FIG. 2, the starting point is an electrically insulating substrate 40 typically formed with ceramic or glass. See FIG. 2*a*. Substrate 40, which provides support for the field emitter, is configured as a plate. In a flat-panel CRT display, substrate 40 constitutes at least part of the backplate.

A lower electrically non-insulating emitter region 42 lies along the top of substrate 40. Lower non-insulating region 42 may be configured in various ways. At least part of non-insulating region 42 is typically patterned into a group of generally parallel emitter-electrode lines referred to as row electrodes. When non-insulating region 42 is configured in this way, the final field-emission cathode is particularly suitable for exciting light-emitting phosphor elements in a flat-panel CRT display. Nonetheless, non-insulating region 42 can be arranged in other patterns, or can even be unpatterned.

A largely homogenous electrically insulating layer 44 is provided on top of the structure. Insulating layer 44 typically consists of silicon oxide. Alternatively, layer 44 could be formed with silicon nitride. Although not shown in FIG. 2*a*, portions of the lower surface of insulating layer 44 may contact substrate 40 depending on the configuration of lower non-insulating region 42. Part of insulating layer 44 later becomes the emitter/gate interelectrode dielectric.

The thickness of insulating layer 44 should be sufficiently great that the later-created electron-emissive elements are shaped as cones whose tips extend slightly above the top of layer 44. The height of each electron-emissive cone depends on its base diameter which, as described below, is determined by the diameter of a spherical particle used in defining a gate opening for that electron-emissive cone. The thickness of insulating layer 44 is normally 1–2 times the diameter of the spherical particles. A typical range for the insulating layer thickness is 0.1–3 $\mu$m.

Figure 2A:
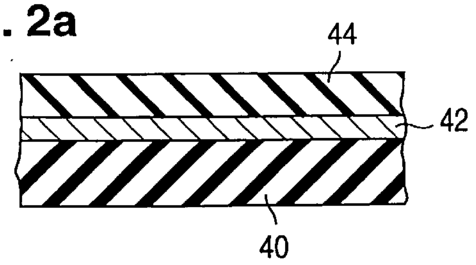
FIGS. 2*a*–2*g* are cross-sectional structural views representing a set of steps in a process that follows the invention's teachings for manufacturing a gated field emitter having conical electron-emissive elements.
Figure 2E:
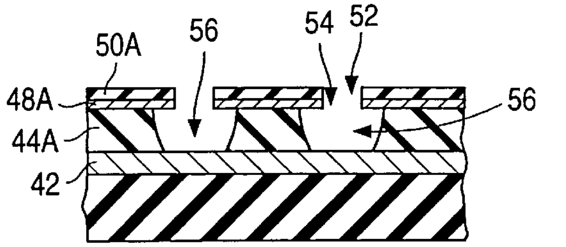
Figure 2B:
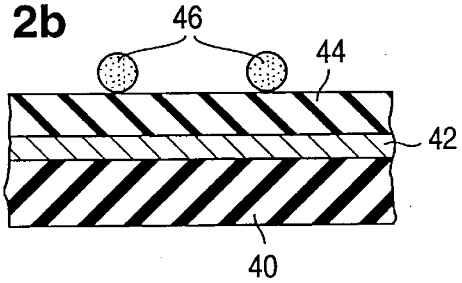

Solid spherical particles 46 are distributed in a random, or largely random, manner across the top of insulating layer 44 as shown in FIG. 2*b*. Spherical particles 46 typically consist of polystyrene. Alternative materials for particles 46 include glass (e.g., silicon oxide), polymers (e.g., latex) other than polystyrene, and polymers coated with functional groups such as alcohol, acid, amide, and sulfonate groups.

When particles 46 consist of polystyrene, they have an average diameter in the range of 0.1–3 $\mu$m, typically 0.3 $\mu$m. The standard deviation in the average particle diameter is normally very small, less than 10%, typically 2%. The average surface density of particles 46 across insulating layer 44 is in the range of $10^6$–$10^{10}$ particles/cm$^2$, preferably $10^7$–$10^9$ particles/cm$^2$. A typical value is $10^8$ particles/cm$^2$. The average spacing between particles 46 is typically 2–3 times the average particle diameter. For 0.3-$\mu$m particles at $10^8$ particles/cm$^2$, the average spacing is on the order of 0.6–0.9 $\mu$m.

Spherical particles 46 adhere quite strongly to insulating layer 44. Van der Waals forces are believed to at least partially provide the adherence mechanism. Part or all of spheres 46 may be charged—e.g., negatively when spheres 46 consist of polystyrene. In the polystyrene case, each sphere 46 typically bears at least one double negative charge, each double negative charge arising from the attachment of a carboxyl group to that sphere 46. A charge of opposite polarity on initial structure 40/42/44 may assist the adherence mechanism. In any case, once attached to insulating layer 44, particles 46 do not move readily across the top of layer 44.

Various techniques may be used to distribute spherical particles 46 across insulating layer 44. In one technique, de-ionized water containing suitably small polystyrene spheres is first combined with a reagent-grade alcohol in a beaker. The alcohol is typically isopropanol. Ethanol is an alternative candidate for the alcohol.

In the isopropanol case, the liquid in the resultant isopropanol/water solution is primarily isopropanol, typically over 99% isopropanol by volume. The polystyrene spheres are suspended in the isopropanol/water solution. Nitrogen is bubbled through the solution to make the distribution of spheres more uniform throughout the solution. Alternatively, the solution can be subjected to ultrasonic agitation to improve the uniformity of the spheres throughout the solution.

With initial structure 40/42/44 being manufactured in the form of a generally circular wafer, the wafer is placed in a spin chamber. While the wafer is in the chamber, a controlled amount of the isopropanol/water solution, including the suspended polystyrene spheres, is deposited on top of the wafer so as to cover a selected portion of the upper wafer surface but not run off the top of the wafer. The wafer is then spun for a short time to remove most of the solution. The spinning speed is 200–2000 rpm, typically 750 rpm. The spinning time is 5–120 sec., typically 20 sec.

During the spin, substantially all of the remaining isopropanol/water solution evaporates, leaving polystyrene spheres 46 behind. If any of the isopropanol/water solution remains, the wafer is dried to remove the remaining isopropanol/water. The drying operation can, for example, be done with a nitrogen jet. Regardless of whether a drying operation is, or is not, performed, the wafer is subsequently removed from the spin chamber. In this way, the structure of FIG. 2*b* is produced.

Electrically non-insulating gate material is deposited on insulating layer 44 and spherical particles 46. The gate material deposition is normally performed in a direction substantially perpendicular to the upper surface of layer 44 using a technique such as evaporation or collimated sputtering. The gate material accumulates on layer 44 in space between particles 46 to form an electrically non-insulating gate layer 48A of relatively uniform thickness. See FIG. 2*c*. Portions 48B of the gate material accumulate simultaneously on the upper halves (hemispheres) of particles 46. The gate material is usually a metal such as chromium, nickel, molybdenum, titanium, tungsten, or gold.

Figure 2F:
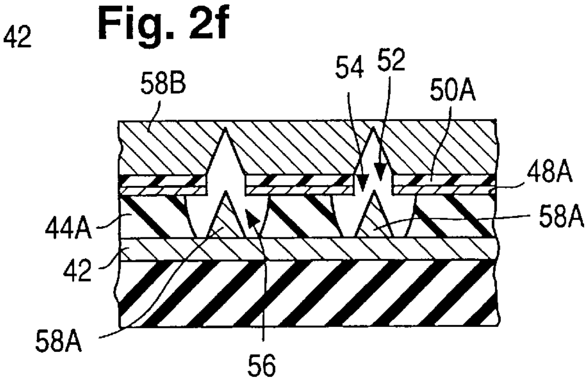
Figure 2C:
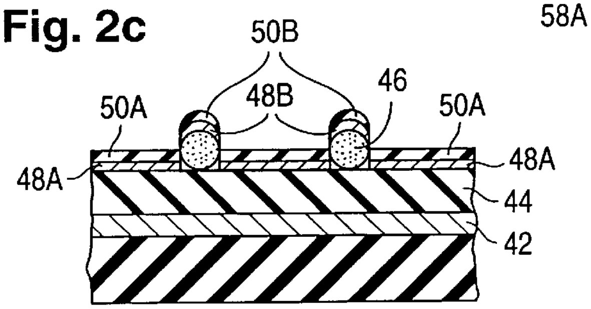

A suitably etchable material, referred to here as the primary material, is deposited on gate layer 48A and gate material portions 48B. As with the gate material deposition, the primary material deposition is normally conducted in a direction substantially perpendicular to the upper surface of interelectrode dielectric layer 44, again using a technique such as evaporation or collimated sputtering. The primary material accumulates on gate layer 48A in space between spherical particles 46 to form a primary layer 50A of relatively uniform thickness as shown in FIG. 2*c*. Portions 50B of the primary material accumulate simultaneously on gate material portions 48B situated on spheres 46. To avoid having primary material portions 50B bridge to primary layer 50A, the total thickness of gate layer 48A and primary layer 50A is normally less than the average radius of spheres 46.

The primary material typically consists of inorganic dielectric material such as silicon nitride, aluminum oxide, or/and silicon oxide. Primary layer 50A is later employed as a lift-off layer in the process of FIG. 2 and in certain process variations described below. In certain other process variations described below, layer 50A does not perform a lift-off function. When layer 50A serves as a lift-off layer, the primary material could alternatively be a metal such as aluminum, tungsten, or gold. The primary material could also be a metal dielectric composite or a salt such as magnesium-fluoride, magnesium chloride, or sodium chloride when layer 50A functions as a lift-off layer.

Spherical particles 46 are now removed. During the removal of particles 46, gate material portions 48B and primary material portions 50B are simultaneously removed to produce the structure shown in FIG. 2*d*. Primary openings 52 extend through primary layer 50A at the locations of removed particles 46. Gate openings 54 similarly extend through gate layer 48A at the locations of removed particles 46. In this way, particles 46 directly define the locations of both primary openings 52 and gate openings 54. Because the formation of gate openings 54 occurs during the deposition of the gate material over particles 46 and is not accomplished by etching the gate material, the candidates for the gate material include gold through which it is difficult to accurately etch small openings—i.e., openings whose diameters are typically less than 1 $\mu$m—that later expose the electron-emissive cones. The same applies to the primary material in the process of FIG. 2.

Each gate opening 54 is vertically centered on, and therefore vertically aligned to, corresponding primary opening 52. Since removed particles 46 are spherical, primary openings 52 are largely circular. For the case in which the depositions to form layers 48A and 50A were performed substantially perpendicular to the upper surface of insulating layer 44, the diameters of each pair of corresponding openings 50 and 52 are approximately the same and thus are approximately equal to the diameter of corresponding removed sphere 46.

A mechanical process is typically used to remove spherical particles 46. For example, particles 46 can be removed by an ultrasonic/megasonic operation. Most of spheres 46 are removed during the ultrasonic part of the removal operation. The ultrasonic operation is typically performed by placing the wafer in a bath of de-ionized water with a small volume percentage (e.g., 1%) of Valtron SP2200 alkaline detergent (2-butylxyethanol and non-ionic surfactant) and subjecting the bath to an ultrasonic frequency. The megasonic operation, which is normally performed after the ultrasonic operation and which removes the remainder of spheres 46, typically entails placing the wafer in another bath of de-ionized water with a small weight percentage (e.g., 0.5%) of Valtron 2200 alkaline detergent and subjecting the bath to a megasonic frequency.

A detergent which largely neutralizes the charges on particles 46 can be used in place of Valtron 2200 detergent during both the megasonic and ultrasonic operations. The charge-neutralizing detergent typically includes ionic surfactant. A high-pressure water jet could alternatively be used to remove spheres 46.

Using primary layer 50A as an etch mask, insulating layer 44 is etched through primary openings 52 and gate openings 54 to form corresponding dielectric openings (or dielectric open spaces) 56 through layer 44 down to lower non-insulating emitter region 42. See FIG. 2*e* in which item 44A is the remainder of insulating layer 44. While, primary layer 50A may be slightly attacked by the etchant used to form dielectric openings 56, the amount of attack is normally not enough to significantly affect the sizes or shapes of primary openings 52. Consequently, each primary opening 52 remains substantially circular even if it is of slightly different diameter than corresponding gate opening 54.

The interelectrode dielectric etch to create dielectric open spaces 56 is normally performed in such a manner that dielectric openings 56 undercut gate layer 48A somewhat. The amount of undercutting is chosen to be sufficient to avoid having the later-deposited emitter cone material accumulate on the sidewalls (or side edges) of dielectric openings 56 and provide electrical leakage paths between the electron-emissive elements and gate layer 48A.

The interelectrode dielectric etch can be performed in various ways such as: (a) an isotropic wet etch using one or more chemical etchants, (b) an undercutting (and thus not fully anisotropic) dry etch, and (c) a non-undercutting (fully anisotropic) dry etch followed by an undercutting etch, wet or dry. When insulating layer 44 and primary layer 50A respectively consist of silicon oxide and silicon nitride, the etch is preferably done in two stages. An anisotropic plasma etch is performed with carbon tetrafluoride to create vertical openings substantially through insulating layer 44 after which an isotropic wet etch is performed with buffered hydrofluoric acid to widen the initial openings and form dielectric openings 56.

Electrically non-insulating emitter cone material is evaporatively deposited on top of the structure in a direction generally perpendicular to the upper surface of insulating layer 44A. The emitter cone material accumulates on primary layer 50A and passes through gate openings 54 to accumulate on lower non-insulating region 42 in dielectric open spaces 56. Due to the accumulation of the cone material on primary layer 50A, the openings through which the cone material enters open spaces 56 progressively close. The deposition is performed until these openings fully close. As a result, the cone material accumulates in dielectric open spaces 56 to form corresponding conical electron-emissive elements 58A as shown in FIG. 2*f*. A continuous layer 58B of the cone material is simultaneously formed on primary layer 50A. The cone material is normally a metal such as molybdenum, nickel, chromium, or niobium, or a refractory metal carbide such as titanium carbide.

Figure 2G:
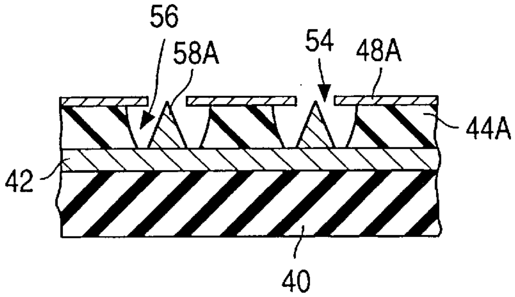

Primary layer 50A is now removed with a suitable etchant. During the removal of layer 50A, excess cone material layer 58B is simultaneously lifted off. FIG. 2*g* shows the resultant electron emitter. Since the cone material deposition was performed generally perpendicular to insulating layer 44A, each electron-emissive cone 58A is vertically centered on corresponding primary opening 52 and also on corresponding gate opening 54.

Gate layer 48A may be patterned into a group of gate lines running perpendicular to the emitter row electrodes of lower non-insulating region 42. The gate lines then serve as column electrodes. With suitable patterning being applied to gate layer 48A, the field emitter of FIG. 2*g* may alternatively be provided with separate column electrodes that contact portions of gate layer 48A and run perpendicular to the row electrodes. This gate patterning and, when included, separate column-electrode formation are typically done before etching insulating layer 44 to form dielectric openings 56 but can be done at a later stage in the process.

Instead of defining the gate openings with spherical particles 46 distributed across the top of insulating layer 44, the gate openings can be defined by spherical particles distributed across a gate layer. Doing so helps to alleviate the above-mentioned constraint imposed by the particle diameter on the gate layer thickness.

Figure 2D:
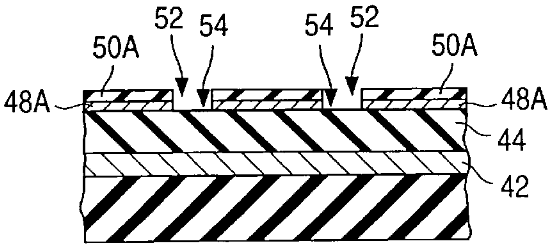
Figure 3A:
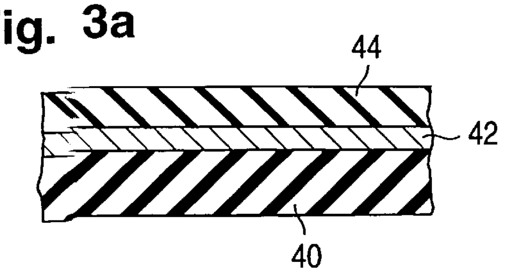
FIGS. 3*a*–3*i* are cross-sectional structural views representing a set of steps in another process that follows the invention's teachings for manufacturing a field emitter having conical electron-emissive elements.
Figure 3B:
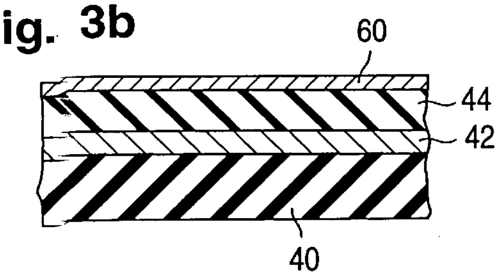

FIG. 3*a*–3*i* (collectively "FIG. 3 ") present an example of a process in which spherical particles are so utilized in accordance with the invention to produce a gated field-emission cathode having conical electron-emissive elements. In the process of FIG. 3, an initial structure consisting of substrate 40, lower non-insulating region 42, and insulating layer 44 is formed in substantially the same way as in the process of FIG. 2. FIG. 3*a*, which repeats FIG. 2*a*, illustrates initial structure 40/42/44 for the process of FIG. 3.

Electrically non-insulating gate material is deposited on insulating layer 44 to form an electrically non-insulating gate layer 60 of relatively uniform thickness. See FIG. 3*b*. The gate material in the process of FIG. 3 is usually a metal such as chromium, nickel, molybdenum, titanium, or tungsten. The gate metal deposition can be performed according to any of a number of deposition techniques such as evaporation, sputtering, and chemical vapor deposition ("CVD") In contrast to the process of FIG. 2, the gate material deposition in the process of FIG. 3 need not be performed substantially perpendicular to the upper surface of interelectrode dielectric layer 44. For the reasons discussed below, at a given sphere diameter, gate layer 60 in the process of FIG. 3 can be thicker than the maximum tolerable thickness of gate layer 48A in the process of FIG. 2.

Figure 3C:
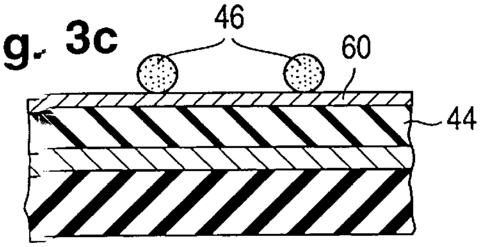
Figure 3D:
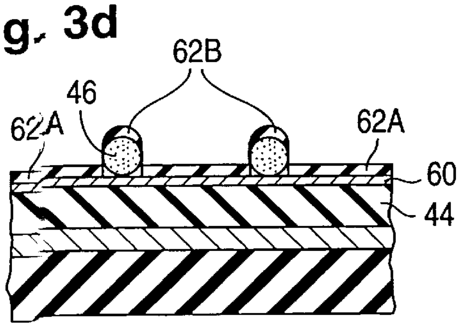

Solid spherical particles 46 are distributed across the top of gate layer 60 as shown in FIG. 3*c*. Spherical particles 46 again typically consist of polystyrene. The particle distribution step is typically performed in the same way as in the process of FIG. 2. The distribution of particles 46 is random, or largely random, across the top of gate layer 60. Spheres 46 in the process of FIG. 3 normally have the same characteristics, including average diameter and standard deviation in average diameter, as in the process of FIG. 2.

A suitably etchable material, again referred to as the primary material, is deposited on gate layer 60 and spherical particles 46. The primary material deposition in the process of FIG. 3 is performed in a direction substantially perpendicular to the upper surface of interelectrode dielectric 44 using a technique such as evaporation or collimated sputtering. Similar to the method of FIG. 2, the primary material in the method of FIG. 3 accumulates on gate layer 60 in space between particles 46 to form a primary layer 62A of relatively uniform thickness. See FIG. 3*d*. Primary layer 62A later serves as a lift-off layer in the process of FIG. 3. Portions 62B of the primary material accumulate simultaneously on the upper halves of spheres 46.

As in the process of FIG. 2, the primary material here typically consists of inorganic dielectric material such as silicon nitride, aluminum oxide, or/and silicon oxide. Likewise, when primary layer 62A performs a lift-off function, the primary material can be (a) a metal such as aluminum, (b) a metal/dielectric composite, or (c) a salt such as magnesium fluoride, magnesium chloride, or sodium chloride.

To avoid having primary material portions 62B bridge to primary layer 62A, the thickness of primary layer 62A is normally less than the average radius of spheres 46. Compared to the process of FIG. 2 where the total combined thickness of gate layer 48A and primary layer 50A normally must be less than the average radius of spheres 46 in order to avoid undesired bridging, the avoidance of undesired bridging places less constraint on the gate layer thickness in the process of FIG. 3 than in the process of FIG. 2. This is especially true when the etch selectively of gate layer 60 to primary layer 62A is high (i.e., layer 60 is etched much more than layer 62A) during the below-described etch to form gate openings through layer 60 using layer 62A as an etch mask. For a given sphere diameter, gate layer 60 can therefore be thicker than gate layer 48A.

In fact, gate layer 60 in the process of FIG. 3 can be considerably thicker than gate layer 48A in the process of FIG. 2. For example, the thickness of gate layer 60A can exceed the average radius, and even the average diameter, of spheres 46. As a comparative examination of the full manufacturing processes of FIGS. 2 and 3 indicates, the method of FIG. 3 requires slightly more processing than the method of FIG. 2. In short, compared to the method of FIG. 2, the method of FIG. 3 significantly alleviates a constraint on the gate layer thickness in exchange for a slight amount of additional fabrication processing.

Returning to the process of FIG. 3, spherical particles 46 are now removed, typically in the same way as in the process of FIG. 2. During the sphere removal, primary material portions 62B are simultaneously removed to produce the structure of FIG. 3*e*. Primary openings 64 extend through primary layer 62A at the locations of removed particles 46. Since particles 46 are spherical, primary openings 64 are largely circular. Also, the diameter of each primary opening 64 is approximately the same as the diameter of corresponding removed sphere 46.

Using primary layer 62A as an etch mask, gate layer 60 is etched through primary opening 64 to form corresponding gate openings 66 through gate layer 60 down to insulating layer 44. See FIG. 3*f*. Item 60A is the remainder of gate layer 60.

The etch to create gate openings 66 may be performed anisotropically. The diameter of each gate opening 66 is then approximately the same as the diameter of the corresponding primary opening 64. Alternatively, the gate opening etch may be performed in such a manner that gate openings 66 undercut primary layer 62A sufficiently to avoid having the later-deposited emitter cone material accumulate on the side edges of gate layer 60A along openings 66. FIG. 3*f* illustrates the undercutting example in which the diameter of each gate opening 66 is greater than the diameter of corresponding primary opening 64.

Regardless of how the gate opening etch is performed, each gate opening 66 is vertically centered on, and therefore vertically aligned to, corresponding primary opening 64. Since primary openings 64 are situated at the locations of removed spheres 46, particles 46 define the locations of gate openings 66 as well as primary openings 64. Because primary openings 64 are circular, gate openings 66 are also largely circular.

The process of FIG. 3 is now completed in largely the same way as the process of FIG. 2. Using primary layer 62A as an etch mask, insulating layer 44 is etched through openings 64 and 66 to form corresponding dielectric openings (or dielectric open spaces) 68 through layer 44 down to lower non-insulating region 42. See FIG. 3*g* in which item 44B is the remainder of insulating layer 44. Dielectric open spaces 68 undercut layers 60A and 62A sufficiently to avoid having the later-deposited emitter cone material accumulate on the sidewalls of dielectric openings 68 and short the electron-emissive elements to gate layer 60A. The etch to create dielectric openings 68 may be performed in any of the ways described above for the interelectrode dielectric etch in the process of FIG. 2.

Electrically non-insulating emitter cone material is evaporatively deposited on top of the structure in a direction generally perpendicular to the upper surface of insulating layer 44B. The emitter cone material again normally is a metal such as molybdenum, nickel, chromium, or niobium, or a refractory metal carbide such as titanium carbide.

The cone material accumulates on primary layer 62A and passes through openings 64 and 66 to accumulate on lower non-insulating region 42 in dielectric open spaces 68. Similar to the process of FIG. 2, the openings through which the cone material enters open spaces 68 progressively close during the course of the cone material deposition. The deposition is likewise performed until these openings fully close. As a result, the cone material accumulates in open spaces 68 to form corresponding conical electron-emissive elements 70A as shown in FIG. 3*h*. A continuous layer 70B of the cone material is formed on primary layer 60A at the same time.

Primary layer 62A is removed. During its removal, excess cone material layer 70B is lifted off. The resultant electron emitter is depicted in FIG. 3*i*. In light of the fact that the cone material deposition was performed generally perpendicular to insulating layer 44B, each conical electron-emissive element 70A is vertically centered on corresponding primary opening 64 and also on corresponding gate opening 66.

Patterning of gate layer 60A into column electrodes running perpendicular to the emitter row electrodes of lower non-insulating region 42 may be done in the same way that gate layer 48A is patterned in the method of FIG. 2. Likewise, with suitable patterning being applied to gate layer 60A, the field emitter of FIG. 3*i* may alternatively be provided with separate column electrodes that contact portions of gate layer 60A and run perpendicular to the row electrodes.

As an alternative to the processes of FIGS. 2 and 3, the gate openings can be defined by spherical particles distributed across a layer, again referred to as the primary layer, formed over the gate layer. In this case, the constraint imposed by the sphere diameter on the thickness of the primary layer is substantially lessened, along with the thickness constraint imposed by the sphere diameter on the thickness of the gate layer.

FIGS. 4*a*–4*f* and either FIG. 4*g*1 or FIG. 4*g*2 (collectively "FIG. 4") illustrate the front-end portion of a process for manufacturing a gated field-emission cathode in which spherical particles deposited on such a primary layer are utilized in defining gate openings according to the invention. To furnish the field emitter with conical electron-emissive elements, the process of FIG. 4 can be completed in accordance with the invention by following either the back-end steps of FIGS. 2*d*–2*g* or the back-end steps of FIGS. 3*f*–3*i*.

In the process of FIG. 4, an initial structure consisting of substrate 40, lower non-insulating region 42, and insulating layer 44 is formed substantially in the manner described above. See FIG. 4*a* which repeats FIG. 2*a*.

Referring to FIG. 4*b*, electrically non-insulating gate layer 60 is formed on insulating layer 44 according to any of the deposition techniques described above for the method of FIG. 3. For a given sphere diameter, gate layer 60 here can again be thicker than gate layer 48A in the method of FIG. 2. Likewise, gate layer 60 here is usually a metal such as chromium, nickel, molybdenum, titanium, or tungsten.

A suitably etchable material referred to as the primary material is deposited on gate layer 60 to form a primary layer 72 of relatively uniform thickness. When the front-end process sequence of FIG. 4 is combined with the back-end steps of FIGS. 2*d*–2*g* or 3*f*–3*i*, primary layer 72 is later utilized as a lift-off layer. Candidates for the primary material here consist of the primary material candidates given above for the process of FIG. 3.

The primary material deposition in the front-end sequence of FIG. 4 can be performed in various ways such as sputtering, evaporation, CVD, electrochemical deposition (provided that primary layer 72 is electrochemically depositable), spinning, and screen printing. In contrast to the processes of FIGS. 2 and 3, the primary material deposition in the process of FIG. 4 need not be performed in a direction substantially perpendicular to the upper surface of insulating layer 44. For the reasons discussed below, at a given sphere diameter, primary layer 72 can be thicker than either of primary layers 50A and 62A in the methods of FIGS. 2 and 3. This is especially beneficial when, for example, increased primary layer thickness is needed to cover bumps in gate layer 60 caused by factors such as bumps in insulating layer 44.

Solid spherical particles 46 are distributed across the top of primary layer 72 as shown in FIG. 4*c*. The particle distribution step is typically performed in the manner described above. The distribution of spheres 46 is thus random, or largely random, across the top of primary layer 72. Particles 46 typically consist of polystyrene and have the other characteristics described above.

Suitably etchable further material is deposited on primary layer 72 and spherical particles 46. The deposition of the further material is performed in a direction substantially perpendicular to the upper surface of insulating layer 44 using a technique such as evaporation or collimated sputtering. The further material accumulates in space between particles 46 to form a further layer 74A. See FIG. 4*d*. Portions 74B of the further material accumulate simultaneously on the upper halves of spheres 46.

To prevent further material portions 74B from bridging to further layer 74A, the thickness of further layer 74A is normally less than the average sphere radius. However, the avoidance of undesired bridging along the surfaces of spheres 46 places less constraint on the primary layer thickness in the process sequence of FIG. 4 than in the processes of FIGS. 2 and 3. This is particularly true when the etch selectivity of primary layer 72 to further layer 74A is high (i.e., layer 72 is etched much more than layer 74A) during the etch described below to form primary openings through layer 72 using further layer 74A as an etch mask. For a given sphere diameter, primary layer 72 thus can be thicker than primary layer 50A in the process of FIG. 2 or primary layer 62A in the process of FIG. 3. Similarly, the necessity to avoid such undesired bridging constrains the gate layer thickness less in the process sequence of FIG. 4 than in the process of FIG. 2 or 3.

When the front-end process sequence of FIG. 4 is completed by the back-end steps of FIGS. 2*d*–2*g* or the back-end steps of FIGS. 3*f*–3*i*, the complete process requires slightly more process operations than the complete process of each of FIGS. 2 and 3. This is the tradeoff for lessening the constraint on the primary layer thickness and, relative to the process of FIG. 2, also lessening the constraint on the gate layer thickness.

The material used to form further layer 74A is a material that can be used as an etch mask for etching primary layer 72A and can also be selectively etched with respect to layer 72A. The further material typically consists of a metal. The further material is typically nickel when the gate material is chromium, and vice versa. However, depending on the selection of other materials used in fabricating the field emitter, the further material could be electrically resistive or electrically insulating.

Spherical particles 46 are now removed, typically in the manner described above. During the sphere removal, further material portions 74B are simultaneously removed to produce the structure of FIG. 4*e*. Further openings 76 extend through further layer 74A at the locations of removed particles 46. Because particles 46 were spherical, further openings 76 are largely circular. The diameter of each further opening 76 is approximately the same as the diameter of corresponding removed sphere 46.

Using further layer 74A as an etch mask, primary layer 72 is anisotropically etched through further openings 76 to form corresponding primary openings 78 through layer 72 down to gate layer 60. See FIG. 4*f* in which item 72A is the remainder of primary layer 72. Each primary opening 78 is vertically centered on, and is of approximately the same diameter as, corresponding further opening 76. Since further openings 76 are situated at the locations of removed spheres 46, the locations of primary openings 78 are defined by particles 46. Also, primary openings 78 are of largely the same shape as further openings 76 and therefore are largely circular.

With further layer 74A still serving as an etch mask, gate layer 60 can be anisotropically etched through further openings 76 and primary openings 78 to form corresponding gate openings 80 through layer 60 down to insulating layer 44. FIG. 4*g*1 illustrates the resultant structure. Item 60B is the remainder of gate layer 60. Since the etch is anisotropic, the diameter of each gate opening 80 is approximately the same as the diameter of corresponding (overlying) opening pair 78 and 76. The gate opening etch can be performed as a continuation of the primary opening etch or as a separate step with a different anisotropic etchant.

Each gate opening 80 is vertically centered on, and thus vertically aligned to, both corresponding primary opening 78 and corresponding further opening 76. Inasmuch as further openings 76 are situated at the locations of removed spheres 46, the locations of gate openings 80 are defined by the locations of particles 46. Also, gate openings 80 are largely circular.

Further layer 74A in FIG. 4*g*1 can now be removed to produce a structure which, except for a partial difference in labeling and potential differences in the gate-layer and primary-layer thicknesses, is substantially identical to the structure of FIG. 2*d*. Items 60B, 72A, 78, and 80 in FIG. 4*g*1 respectively correspond to items 48A, 50A, 52, and 54 in FIG. 2*d*. Subject to this labeling difference, the front-end processing sequence of FIG. 4 is completed according to the above-mentioned back-end steps that lead from the structure of FIG. 2*d* to the final structure of FIG. 2*g*. Conical electron-emissive elements 58A thereby extend through gate openings 52 (80) in gate layer 48A (60B) of the so-completed field emitter.

Alternatively, when applying the back-end portion of the method of FIG. 2 to the front-end processing sequence of FIG. 4, dielectric openings 56 can be formed in insulating layer 44 when further layer 74A is still in place and serves as an etch mask. In this case, further layer 74A is removed immediately prior to the cone material deposition of FIG. 2*f*.

As another alternative, further layer 74A can be removed directly after forming primary openings 78 at the stage shown in FIG. 4*f* and therefore before creating gate openings 80 at the stage shown in FIG. 4*g*1. Using primary layer 72A as an etch mask, gate openings 80 are formed by anisotropically etching gate layer 60 through primary openings 78 to produce the structure of FIG. 2*d*, again subject to partially different labeling (gate openings 80 in FIG. 4 become gate openings 54 in FIG. 2) and potential differences in the gate-layer and primary-layer thicknesses. The processing steps leading from the structure of FIG. 2*d* to the structure of FIG. 2*g* are then undertaken in the manner described above to form the field emitter.

Instead of performing an anisotropic, and therefore non-undercutting, etch through openings 76 and 78, an undercutting etch can be performed on gate layer 60 of FIG. 4*f* through openings 76 and 78 to form corresponding gate openings 82 through layer 60 down to insulating layer 44. See FIG. 4*g*2 in which item 60C is now the remainder of gate layer 60. With gate openings 82 undercutting primary layer 72A, the diameter of each gate opening 82 is greater than the diameter of corresponding (overlying) opening pair 78 and 76. Each gate opening 82 is largely circular and is vertically centered on corresponding opening pair 78 and 76. Since further openings 76 are situated at the locations of removed spheres 46, spherical particles 46 define the locations of gate openings 82.

Further layer 74A in FIG. 4*g*2 can be removed to produce a structure which, except for a partial labeling difference and potentially a difference in the primary-layer thickness, is substantially identical to the structure of FIG. 3*f*. Items 60C, 72A, 78, and 82 in FIG. 4*g*2 respectively correspond to items 60A, 62A, 64, and 66 in FIG. 3*f*. Subject to this labeling difference, the front-end processing sequence of FIG. 4 is now completed according to the above-mentioned back-end steps that lead from the structure of FIG. 3*f* to the structure of FIG. 3*i*. Conical electron-emissive elements 70A are thereby exposed through gate openings 66 (82) in gate layer 60A (60C) of the so-completed field emitter.

As a further alternative in applying the back-end portion of the process of FIG. 3 to the front-end processing sequence of FIG. 4, further layer 74A can be removed directly after forming primary openings 78 at the stage shown in FIG. 4*f*. Using primary layer 72A as an etch mask, gate openings 82 are created by performing an undercutting etch on gate layer 60 through primary openings 78 to produce the structure of FIG. 3*f*, again subject to partially different labeling (gate openings 82 in FIG. 4 become gate openings 66 in FIG. 3) and potentially a difference in the primary-layer thickness. The processing steps leading from the structure of FIG. 3*f* to the structure of FIG. 3*i* are then undertaken to finish the field emitter in the manner described above.

Looking now at the various electron emitters manufactured according to the fabrication steps of FIGS. 2–4 including the above-mentioned variations, the locations of the conical electron-emissive elements, such as cones 58A or 70A, are determined by the locations of the primary openings, such as openings 52, 64, or 78. Since the locations of the primary openings are determined (directly or indirectly) by the locations of spherical particles 46, the locations of the electron-emissive cones are defined by particles 46.

The electron-emissive cones are situated at random, or largely random locations, relative to one another since the surface distribution of particles 46 is random, or largely random. Nonetheless, the number of electron-emissive cones per unit area does not vary greatly from place to place across the entire electron-emitting area.

The base diameter of each electron-emissive cone in each of the electron emitters manufactured according to the fabrication steps of FIGS. 2–4 (again including the above-mentioned process variations) is approximately the same as the base diameter of the corresponding primary opening and thus is approximately the same as is the diameter of corresponding removed sphere 46. Consequently, the average base diameter of the electron-emissive cones is controlled by adjusting the average diameter of particles 46. Decreasing the average particle diameter causes the average cone diameter to be decreased by an approximately equal amount, and vice versa. In this way, particles 46 determine the lateral area occupied by the electron-emissive cones. Inasmuch as spheres 46 define the locations of the electron-emissive cones, the average spacing between the cones is controlled by adjusting the average surface density and average diameter of spheres 46.

The standard deviation in the average diameter of particles 46 is, as noted above, quite small compared to the average particle diameter. The standard deviation in the average base diameter of the electron-emissive cones is thus, to a first approximation, equally small compared to the average cone base diameter. Since particles 46 are spherical, the base of each electron-emissive cone is largely circular. The lateral areas occupied by the cones are largely equal. By appropriately adjusting parameters such as the thickness of interelectrode dielectric layer 44, electron-emissive elements of highly uniform size and shape can be achieved.

The electron-emissive elements are preferably fabricated so as to be small and closely spaced together. This is accomplished by utilizing spheres of suitably small average sphere diameter and by distributing an appropriately high density of spheres 46 across the sphere-receiving surface. With there being little variation in the sizes and shapes of the individual electron-emissive cones for a particular area electron emitter, the electron emission is relatively uniform across the electron-emitting area. Importantly, this highly desirable feature is achieved largely by controlling the size and surface density of particles 46, thereby enabling the electron current to be well controlled.

Fabrication of Field Emitters with Electron-Emissive Filaments

A gated field-emission cathode having electron-emissive elements shaped like filaments, rather than cones, can be produced in accordance with the invention's teaching by utilizing a suitable back-end filamentary process sequence to complete the front-end process sequence of FIG. 4, as ended with FIG. 4*g*1, or to complete the front-end portion of the process of either of FIGS. 2 and 3.

FIGS. 5*a*–5*g* (collectively "FIG. 5") illustrate a back-end processing sequence which is so applied to the front-end sequence of FIGS. 4*a*–4*f* and 4*g*1 and which utilizes spacers in accordance with the invention to produce a gated field emitter having filamentary electron-emissive elements. Referring to FIG. 4*g*1, an anisotropic etch is performed on insulating layer 44 through further openings 76, primary openings 78, and gate openings 80 using further layer 74 as an etch mask to form corresponding dielectric openings 100 through layer 44 down to lower non-insulating region 42. This leads to the structure of FIG. 5*a* in which item 44C is the remainder of insulating layer 44. Each dielectric opening 100 is vertically centered on, and is of approximately the same diameter as, corresponding opening triad 76, 78, and 80. Also, dielectric openings 100 are largely circular.

Figure 5A:
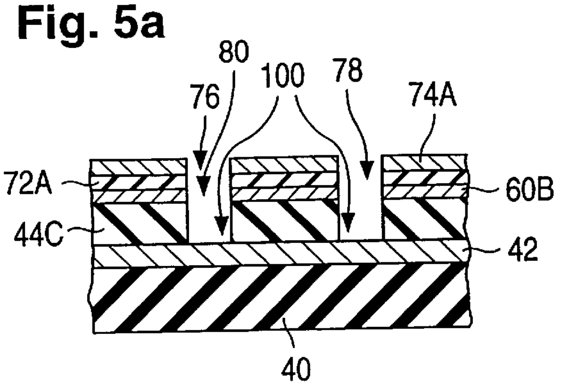
FIGS. 5*a*–5*g* are cross-sectional structural views representing a set of back-end steps by which the front-end structure of FIG. 4*e*, 4*f*, or 4*g*1 is further processed according to the invention to produce a gated field emitter having filamentary electron-emissive elements. Alternatively, the front-end structure of FIG. 2*d* or 3*e* can be further processed in accordance with the invention by utilizing the back-end steps of FIGS. 5b–5g to produce a gated field emitter having filamentary electron-emissive elements.
Figure 5B:
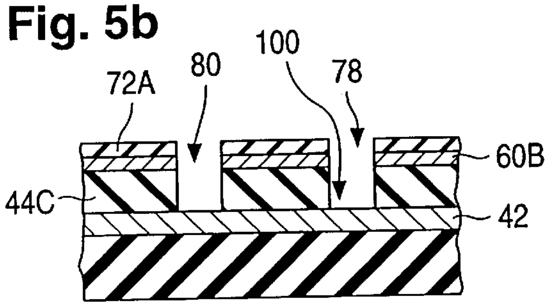

Further layer 74A is removed with etchant that does not significantly attack primary layer 72A or any other part of the structure. FIG. 5*b* depicts the resultant structure.

Figure 5C:
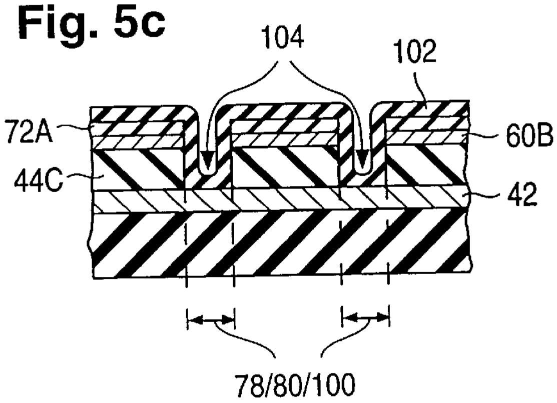
Figure 5D:
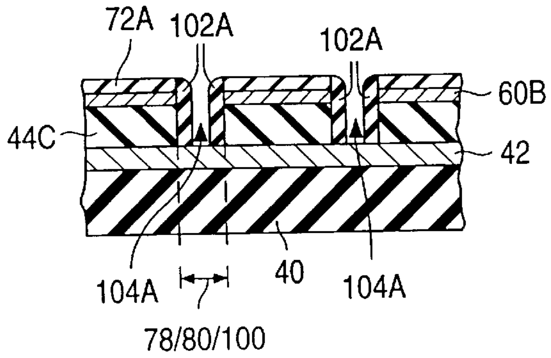

Suitably etchable spacer (or coating) material is conformally deposited on primary layer 72A and into composite openings 78/80/100 down to lower non-insulating region 42 to form a blanket spacer (or coating) layer 102 as shown in FIG. 5*c*. Spacer layer 102 covers the top of the structure but does not completely fill openings 78/80/100. Depressions 104 are present at the unfilled portions of openings 78/80/100. Each depression 104 is vertically centered on corresponding composite opening 78/80/100.

CVD is typically used to deposit the spacer material. Consequently, the thickness of spacer layer 102 along the side edges of layers 72A, 60B, and 44C along each composite opening 78/80/100 is relatively uniform (constant) at any given height.

The spacer material is typically chosen to be commonly etchable with the primary material of layer 72A. The spacer material also preferably has a high etch selectivity relative to the interelectrode dielectric (layer 44C here). In particular, the spacer material is typically the same as the primary material and different from the interelectrode dielectric. For example, the spacer material is normally silicon nitride when (a) the primary material consists of silicon nitride and (b) the interelectrode dielectric consists of silicon oxide.

An anisotropic etch is performed to remove substantially all of spacer layer 102 except for portions 102A that cover (a) the side edges of primary layer 72A along primary openings 78, (b) the side edges of gate layer 60B along gate openings 80, and (c) the side edges of insulating layer 44C along dielectric openings 100. See FIG. 5*d*. Inasmuch as central portions of spacer layer 102 at the bottoms of dielectric openings 100 are removed during the etch, depressions 104 are extended down to lower non-insulating region 42 and slightly widened (not shown in FIG. 5*d*) to become corresponding apertures 104A. Since depressions 104 were vertically centered on composite openings 78/80/100, each aperture 104A is vertically centered on corresponding composite opening 78/80/100.

Figure 5E:
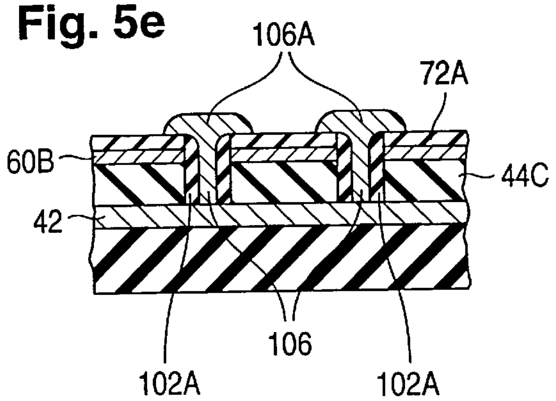
Figure 5F:
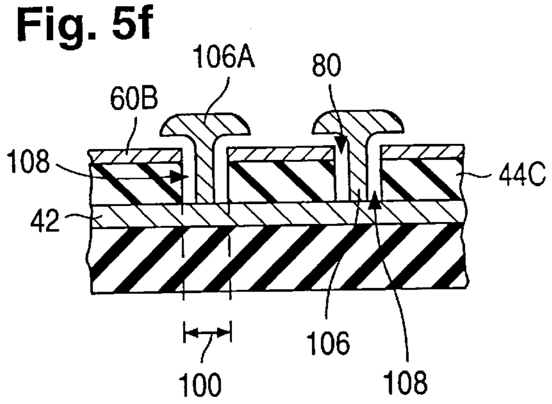

Electrically non-insulating emitter filament material is electrochemically deposited (electroplated) into apertures 104A to form corresponding precursor electron-emissive elements 106 that contact lower non-insulating region 42. FIG. 5*e* depicts the resulting structure. During the electrochemical deposition, the combination of primary layer 72A, spacer portions 102A, and insulating layer 44C encapsulates gate layer 60B (except possibly along the lateral perimeter of the structure) to prevent precursor electron-emissive elements 106 from contacting layer 60B. The lateral spacing between gate layer 60B and precursor elements 106 is determined by the thickness of spacers 102A.

The emitter filament material is normally a metal such as nickel or platinum. When precursor filaments 106 are later sharpened by an electropolishing technique, the filament material is normally different from the gate material.

The electrochemical deposition is typically done in the manner described in Spindt et al, U.S. patent application Ser. No. 8/269,229, filed Jun. 29, 1994, now U.S. Pat. No. 5,564,959. The contents of Ser. No. 8/269,229 are incorporated by reference herein. During the electrochemical deposition, lower non-insulating region 42 serves as the deposition cathode. A deposition anode is situated in the deposition electrolyte a short distance above primary layer 72A.

The electrochemical deposition is conducted for a time sufficiently long to overfill apertures 104A but not cause precursor electron-emissive elements 106 to meet one another along the top of primary layer 72A. Consequently, each precursor element 106 has a cap portion 106A that extends out of corresponding aperture 104A. The overfill of apertures 104A helps to assure that the final electron-emissive filaments will not be of significantly different height due to differences in the nucleation and growth of the filament material.

Primary layer 72A and spacers 102A are removed, preferably with etchant that does not significantly attack insulating layer 44C. See FIG. 5*f*. As a result of the etch, precursor electron-emissive elements 106 are separated from gate layer 60B and insulating layer 44C by cylindrical apertures 108.

When primary layer 72A and spacers 102A consist of the same material (e.g., silicon nitride), the etch is typically performed in a single step with a wet chemical. Alternatively, a plasma having an isotropic component can be used to perform the etch. The etch can be done in two stages when layer 72A and spacers 102A are formed with different materials.

Figure 5G:
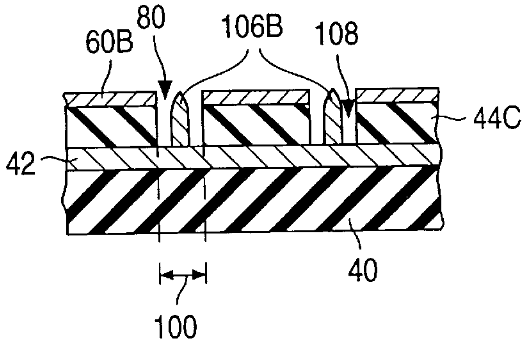

Precursor elements 106 are processed to remove caps 106A and provide the remaining filamentary portions with sharp tips that extend at least partially through gate openings 80. FIG. 5*g* shows the final gated field emitter in which sharpened filamentary electron-emissive elements 106B are the remainders of precursor elements 106. Since apertures 104A were vertically centered on composite openings 78/80/100, each electron-emissive filament 106B is vertically centered on corresponding gate opening 80.

The conversion of precursor electron-emissive elements 106 into electron-emissive filaments 106B is preferably done electrochemically according to an electropolishing/sharpening technique of the type described in U.S. patent application Ser. No. 8/269,229 cited above. Lower non-insulating emitter region 42 in conjunction with precursor elements 106 serves as the anode during the electropolishing/sharpening operation. Gate layer 60B functions as the cathode. During the electropolishing/sharpening operation, the material of precursor elements 106 is removed generally along the plane of gate layer 60B, causing elements 106 to be pinched off and form sharpened tips. Cap portions 106A are washed away in the electropolishing/sharpening electrolyte, leaving electron-emissive filaments 106B as depicted in FIG. 5*g*.

Because gate openings 80 were vertically concentric with further openings 76, each gate opening 80 is vertically centered on the location of corresponding removed sphere 46. Consequently, the locations of electron-emissive filaments 106B are defined by (the locations of) spherical particles 46.

Also, the diameter of each aperture 104A equals the diameter of corresponding composite opening 70/80/100 minus twice the thickness of corresponding spacer 102A. Since the diameter of each composite opening is approximately the same as the diameter of corresponding removed sphere 46, the lateral areas occupied by filaments 106B are controlled by the size of spheres 46 and the thickness of spacers 102A.

The spacer thickness varies little from spacer 102A to spacer 102A. As mentioned above, the size of spherical particles 46 varies little from one sphere 46 to another. Inasmuch as the surface density of spheres 46 did not vary greatly across primary layer 72, the sphere size and surface density in combination with the spacer thickness can be suitably adjusted so that filaments 106B provide highly uniform electron emission across the electron-emitting area at a controllable magnitude of the electron current.

Instead of starting the back-end process sequence of FIG. 5 from the structure of FIG. 4*g*1, further layer 74A could be removed directly after the step shown in FIG. 4*f*. With primary layer 72A now serving as an etch mask, gate layer 60 and insulating layer 44 are anisotropically etched through primary openings 78 (and through gate openings 80 for layer 44) to produce the structure of FIG. 5*b*. A two-stage etch process is typically used, one stage for layer 60 and the second for layer 44. From this point on, the structure of FIG. 5*b* is further processed in the way described above for FIGS. 5*c*–5*g*.

The front-end portions of the methods of FIGS. 2 and 3 can be combined with the back-end process sequence of FIG. 5 in ways similar to that described above. Starting from the structure of FIG. 2*d*, dielectric openings 100 can be created through insulating layer 44 by performing an anisotropic etch on layer 44 through openings 52 and 54 using primary layer 50A as an etch mask. Except for partially different labeling and potential differences in the primary-layer and gate-layer thicknesses, the structure of FIG. 5*b* is produced.

Figure 3E:
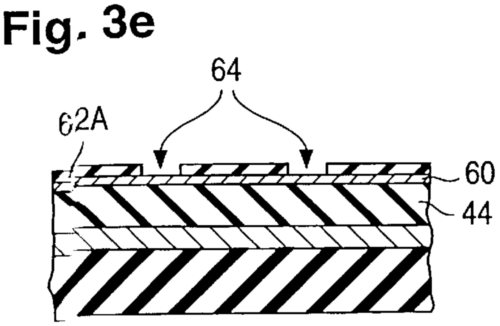
Figure 3F:
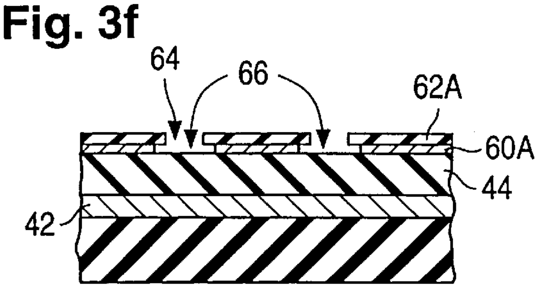
Figure 3G:
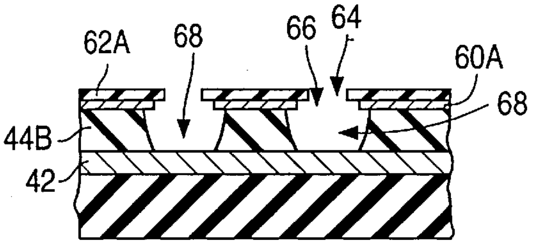
Figure 3H:
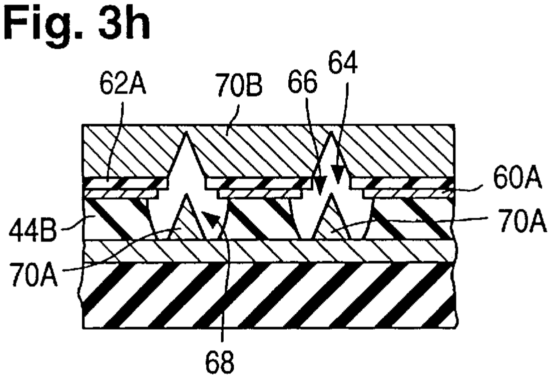
Figure 3I:
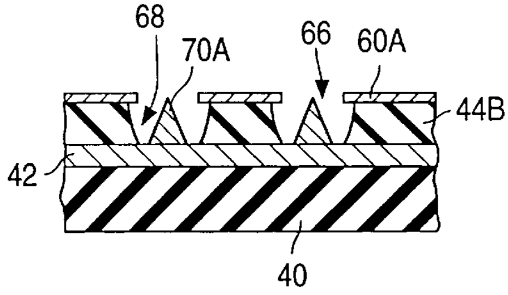

Similarly, starting from the structure of FIG. 3*e*, gate openings 80 and dielectric openings 100 can be created by anisotropically etching gate layer 60 and insulating layer 44 through primary openings 64 using primary layer 62A as an etch mask. The anisotropic etch is typically performed in two stages, one for layer 60 and the second for layer 44. Subject to partial differences in labeling and a potentially different primary-layer thickness, the structure of FIG. 5*b* is again produced.

In the alternatives described in the preceding three paragraphs, each gate opening 80, 66, or 54 is vertically centered on the location of corresponding removed sphere 46 because the gate openings were vertically concentric with primary openings 78, 64, or 52. Spheres 46 therefore define the locations of electron-emissive filaments 106B. Also, the combination of spheres 46 and spacers 102A controls the lateral areas occupied by filaments 106B. Accordingly, filaments 106B can provide highly uniform electron emission at a controlled magnitude by suitably adjusting the sphere size and surface density in combination with the spacer thickness.

Figure 6A:
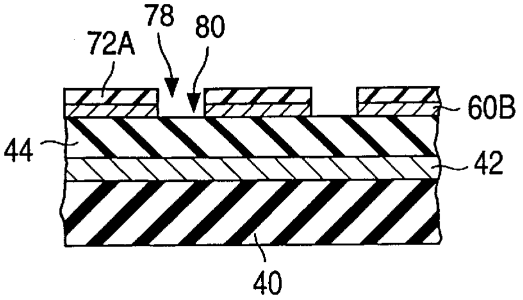
FIGS. 6a–6h are cross-sectional structural views representing another set of back-end steps by which the front-end structure of FIG. 4e, 4f, or 4g1 is further processed according to the invention to produce a gated field emitter having filamentary electron-emissive elements. Alternatively, the front-end structure of FIG. 2d or 3e can be further processed in accordance with the invention by utilizing the back-end steps of FIGS. 6a–6h to produce a gated field emitter having filamentary electron-emissive elements.
Figure 6E:
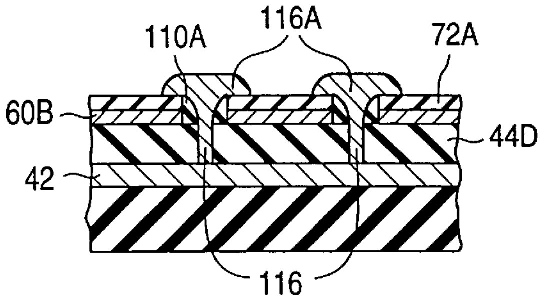
Figure 6B:
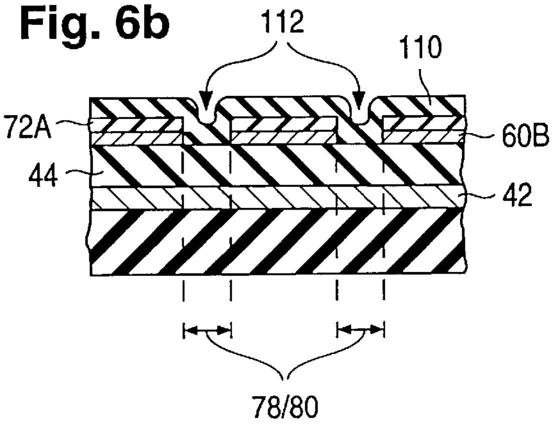
Figure 6F:
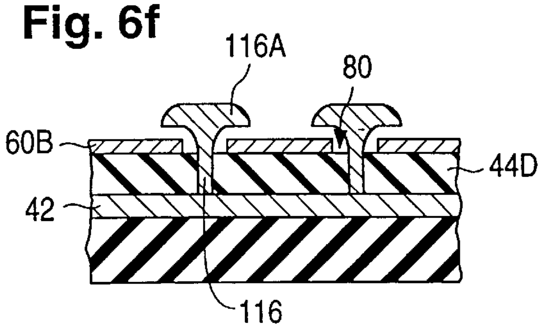
Figure 6C:
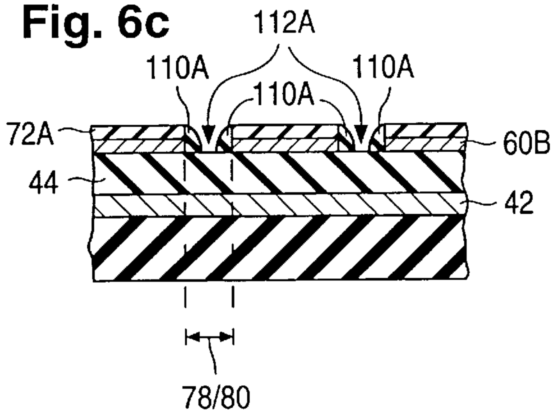
Figure 6G:
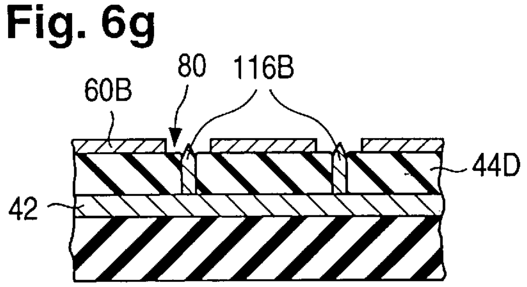
Figure 6D:
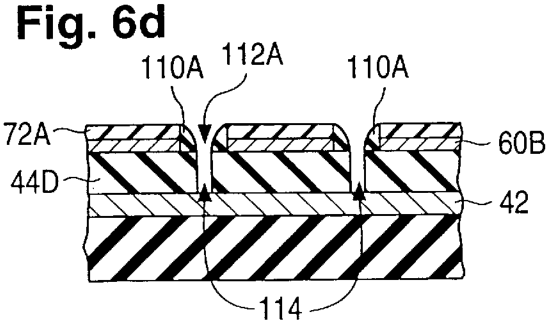
Figure 6H:
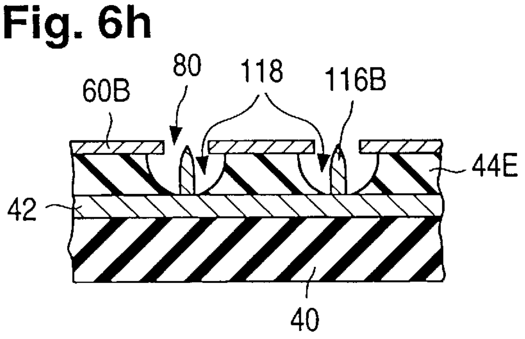

FIGS. 6*g*–6*h* (collectively in FIG. 6) depict another back-end process sequence which is applied to the front-end process sequence of FIGS. 4*a*–4*f* and 4*g*1 and which utilizes spacers in accordance with the invention to produce a gated field-emission cathode having filamentary electron-emissive elements. After forming the structure of FIG. 4*g*1, further layer 74A is removed. This leads to the structure of FIG. 6*a*.

Suitably etchable spacer (or coating) material is conformally deposited on primary layer 72A and into composite openings 78/80 to form a blanket spacer (or coating) layer 110 as shown in FIG. 6*b*. Spacer layer 110 covers the top of the structure but does not completely fill openings 78/80. Depressions 112 are present at the unfilled portions of openings 78/80. Each depression 112 is vertically centered on corresponding composite opening 78/80.

CVD is normally used to deposit the spacer material. The thickness of spacer layer 110 along the side edges of layers 72A and 60B along each composite opening 78/80 is relatively uniform at any given height. The spacer material in the process sequence of FIG. 6 has the same characteristics relative to the primary material and the interelectrode dielectric as in the process sequence of FIG. 5.

An anisotropic etch is performed to remove substantially all of spacer layer 110 except for annular portions 110A that cover (a) the side edges of primary layer 72A along primary openings 78 and (b) the side edges of gate layer 60B along gate openings 80. See FIG. 6*c*. Depressions 112 are thereby extended down to insulating layer 44 and slightly widened (not shown in FIG. 6*c*) to become corresponding apertures 112A. Since depressions 112 were vertically centered on openings 78/80, each aperture 112A is vertically centered on corresponding opening 78/80.

Using primary layer 72A and annular spacer portions 110A as an etch mask, insulating layer 44 is anisotropically etched through apertures 112A to form dielectric openings 114 through layer 44 down to lower non-insulating region 42. See FIG. 6*d*. Item 44D is the remainder of insulating layer 44.

Electrically non-insulating emitter filament material is electrochemically deposited into composite openings (or apertures) 112A/114 to form precursor electron-emissive filaments 116 that contact non-insulating 42. The resulting structure is shown in FIG. 6*e*. During the electrochemical deposition, the combination of primary layer 72, spacers 110A, and insulating layer 44D encapsulates gate layer 60B (except possibly along the lateral periphery of the structure) to prevent precursor electron-emissive elements 116 from contacting gate layer 60B. Spacers 116A determine the lateral spacing between gate layer 60B and precursor elements 116. The emitter filament material is again normally a metal such as nickel or platinum.

The electrochemical deposition is performed in the manner described above for the process sequence of FIG. 5. The deposition time is sufficiently long to overfill openings 112A/114 but typically not long enough to cause precursor elements 116 to meet one another along the top of primary layer 72A. Each precursor electron-emissive element 116 thus has a cap portion 116A that extends out of corresponding aperture 112A/114. As in the process sequence of FIG. 5, the overfilling reduces the likelihood of creating electron-emissive filaments of significantly different height due to differences in the nucleation and growth of the filament material.

Primary layer 72A and spacers 110A are removed, preferably with etchant that does not significantly attack insulating layer 44D or gate layer 60B. See FIG. 6*f*. Outer portions of gate openings 80 are thereby reopened. These portions of gate openings 80 now separate precursor elements 116 from gate layer 60B. When primary layer 72A and spacers 110A are formed with the same material, the etch is typically done in a single step with a wet chemical or a plasma having an isotropic component. A two-stage etch process is normally used when layer 72A and spacers 110A consist of different materials.

Precursor electron-emissive elements 116 are processed to remove cap portions 116A and to provide the remaining filamentary portions with sharpened tips that extend at least partially through gate openings 80. See FIG. 6*g* in which sharpened filamentary electron-emissive elements 116B are the remainders of precursor elements 116. Electron-emissive filaments 116B are created from precursor elements 116 by an electropolishing/sharpening technique in substantially the same way as that utilized to produce electron-emissive filaments 106B in the process sequence of FIG. 5. Consequently, each electron-emissive filament 116B is vertically centered on corresponding gate opening 80.

Using gate layer 60B as an etch mask, insulating layer 44D is etched through gate openings 80 in an undercutting, typically isotropic, manner to form corresponding dielectric open spaces 118 around electron-emissive filaments 116B. FIG. 6*h* shows the resultant structure. Item 44E is the remainder of insulating layer 44D. Dielectric open spaces 118 may extend partially or fully through insulating layer 44E. FIG. 6*h* illustrates the fully through case.

The electropolishing/sharpening step can be performed before creating dielectric open spaces 118. The final structure appears substantially the same as shown in FIG. 6*b*. Alternatively, dielectric open spaces 118 can be formed by an anisotropic etch so that open spaces 118 do not significantly undercut gate layer 60B.

With each gate opening 80 being vertically centered on the location of corresponding removed sphere 46, the locations of spherical particles 46 define the locations of electron-emissive filaments 116B. Similar to the process of FIG. 5, the lateral areas occupied by filaments 116B are controlled by spheres 46 and spacers 110.

Instead of beginning the back-end process sequence of FIG. 6 at the structure of FIG. 4*g*1, the back-end process sequence can be started at the structure of FIG. 4*f*. Further layer 74A is removed. Using primary layer 72A as an etch mask, gate layer 60 is anisotropically etched through primary openings 78 to produce the structure of FIG. 6*a*.

The front-end portion of the process of each of FIGS. 2 and 3 can also be completed with the back-end process sequence of FIG. 6 in accordance with the invention to produce a gated field emitter having filamentary electron-emissive elements. Subject to partial differences in labeling and potential differences in the primary-layer and gate-layer thicknesses, the structure of FIG. 6*a* repeats the structure of FIG. 2*d* to serve as a joining point for the front-end portion of the process of FIG. 2 and the back-end process sequence of FIG. 6.

The structure of FIG. 3*e* serves as a joining point for the front-end portion of the process of FIG. 2 and the back-end process sequence of FIG. 6. Referring to FIG. 3*e*, gate openings 80 are created by anisotropically etching gate layer 60 through primary openings 64 using primary layer 62A as an etch mask. Subject to partial differences in labeling and a potentially different primary layer thickness, the structure of FIG. 6*a* is again produced.

In the alternatives described in the two preceding paragraphs, the locations of filaments 116B are again defined by particles 46. Likewise, spheres 46 and spacers 110 control the lateral areas occupied by filaments 116B. The sphere size and surface density, along with the spacer thickness, can then be appropriately varied so that filaments 116B provide highly uniform electron emission at a controlled magnitude.

Figure 7A:
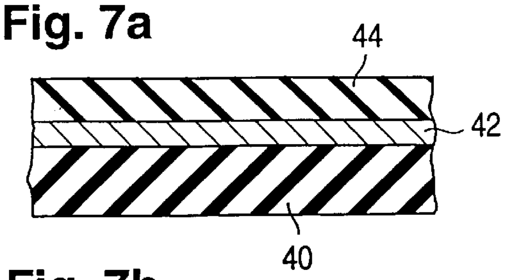
FIGS. 7a–7j are cross-sectional structural views representing a set of steps in a process according to the invention for manufacturing a gated field emitter having filamentary electron-emissive elements.
Figure 7B:
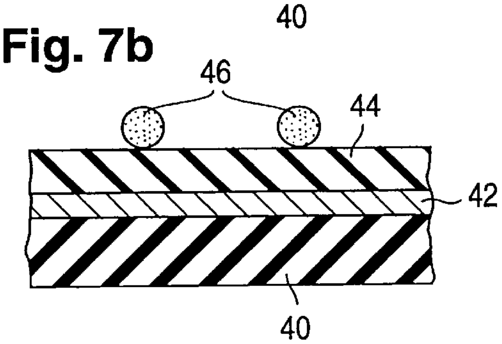
Figure 7C:
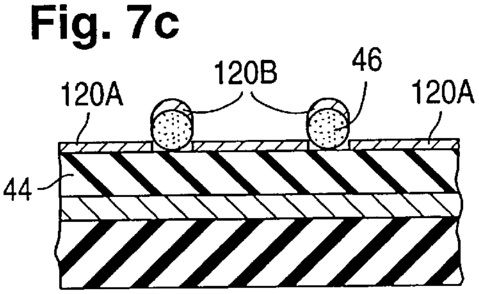

FIGS. 7*a*–7*j* (collectively "FIG. 7") present an example of a full process for manufacturing a gated field-emission cathode which employs spherical particles to define gate openings and which utilizes spacers in creating filamentary electron-emissive elements in accordance with the invention. In the process of FIG. 7, an initial structure consisting of substrate 40, lower non-insulating region 42, and insulating layer 44 is formed in substantially the same way as in the process of FIG. 2. FIG. 7*a*, which repeats FIG. 2*a*, illustrates structure 40/42/44 for the process of FIG. 7. Likewise, as shown in FIG. 7*b*, solid spherical particles 46 are distributed across the top of insulating layer 44. The sphere deposition is performed according to the random, or largely random, technique described above for the process of FIG. 2.

Electrically non-insulating gate material is deposited on insulating layer 44 and spherical particles 46, preferably in a direction substantially perpendicular to the upper surface of layer 44 using a technique such as evaporation or collimated sputtering. The gate material accumulates on insulating layer 44 in space between particles 46 to form an electrically non-insulating gate layer 120A of relatively uniform thickness. See FIG. 7*c*. Portions 120B of the gate material simultaneously accumulate on the upper halves of spheres 46. To avoid having gate material portions 120B bridge to gate layer 120A, the thickness of gate layer 120A is normally less than the average sphere radius. The gate material typically consists of a metal such as chromium, nickel, molybdenum, titanium, tungsten, or gold.

Spheres 46 are removed, typically according to the technique utilized in the process of FIG. 2. During the sphere removal, gate material portions 120B are removed to produce the structure of FIG. 7*d*. Gate openings 122 extend through gate layer 120A at the respective locations of removed particles 46. Gate openings 122 are largely circular since particles 46 are spherical. The diameter of each gate opening 122 is approximately the same as the diameter of corresponding removed sphere 46. Since gate openings 122 are created during the deposition of gate layer 120A without the necessity for a gate layer etch, the gate material here can be gold.

Figure 7D:
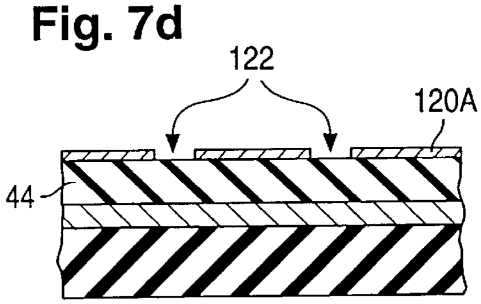
Figure 7E:
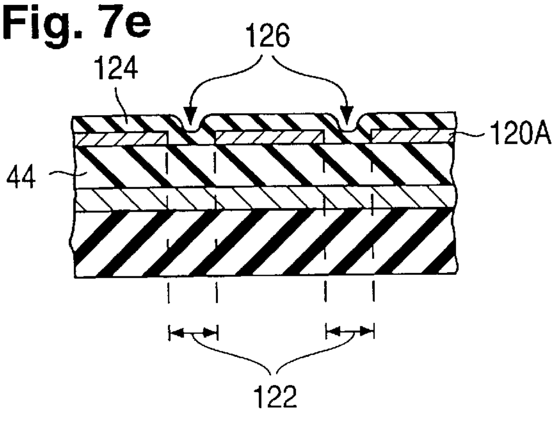

Suitably etchable spacer (or coating) material is deposited, typically in a conformal manner, on gate layer 120A and into gate openings 122 down to insulating layer 44 to form a blanket spacer (or coating) layer 124 as shown in FIG. 7*e*. Spacer layer 124 covers the top of the structure but does not completely fill gate openings 122. Depressions 126 are present at the unfilled portions of gate openings 122. Each depression 126 is vertically centered on corresponding gate opening 122.

With CVD being used to deposit the spacer material, the thickness of spacer layer 124 at the side edges of gate layer 120 along each gate opening 122 is relatively uniform at any given height. The spacer material is chosen so as to be selectively etchable with respect to the gate material and the interelectrode dielectric. The spacer material is typically an electrical insulator (the case shown in FIG. 7*e*) such as silicon nitride but could be an electrical non-insulator, for example, a metal such as aluminum. When the spacer material consists of metal, the spacer material deposition can be performed electrochemically. In this case, the deposition is typically not conformal across the upper surface of the structure.

An anisotropic etch is performed to remove substantially all of spacer layer 124 except for portions 124A that cover the side edges of gate layer 120A along gate openings 122. See FIG. 7*f*. Inasmuch as central portions of spacer layer 124 at the bottoms of gate openings 122 are removed during the etch, depressions 126 are extended through spacer layer 124 down to insulating layer 44 and are slightly widened (not shown in FIG. 7*f*) to become apertures 126A.

Figure 7F:
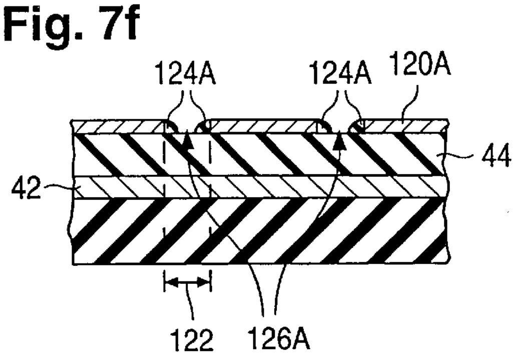
Figure 8A:
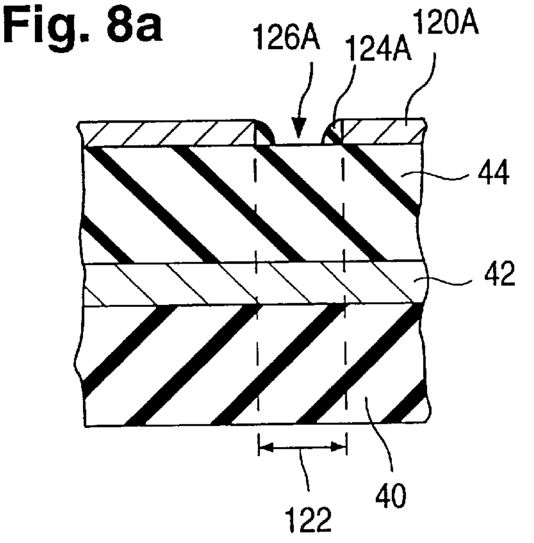
FIGS. 8a and 8b are expanded cross-sectional structural views of portions of FIGS. 7f and 7h centering around the fabrication of one of the electron-emissive elements.

Each spacer portion 124A is pictorially quite small in FIG. 7*f*. To illustrate spacers 124A more clearly, FIG. 8*a*presents an enlarged view of a portion of the structure of FIG. 7*f* centered around the intended location for the left-hand electron-emissive element.

Using gate layer 120A and spacers 124A as an etch mask, insulating layer 44 is anisotropically etched through apertures 126A to form corresponding dielectric openings 128 through layer 44 down to lower non-insulating region 42. See FIG. 7*g*. Item 44F is the remainder of insulating layer 44. Since depressions 126 were vertically centered on gate openings 122, each composite opening 126A/128 is vertically centered on corresponding gate opening 122.

Electrically non-insulating filament material is electrochemically deposited into composite openings (or apertures) 126A/128 to form precursor electron-emissive elements 130 that contact lower non-insulating region 42. FIG. 7*h* depicts the resulting structure. The electrochemical deposition is again typically performed in the manner described in U.S. patent application Ser. No. 8/269,229 cited above. Likewise, the emitter filament material again normally is a metal such as nickel or platinum.

Figure 7H:
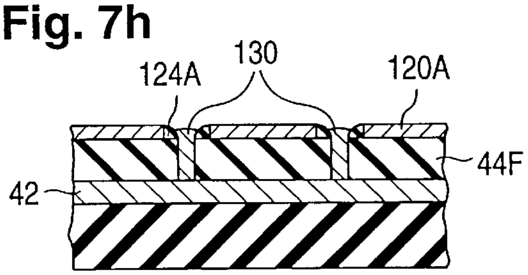
Figure 8B:
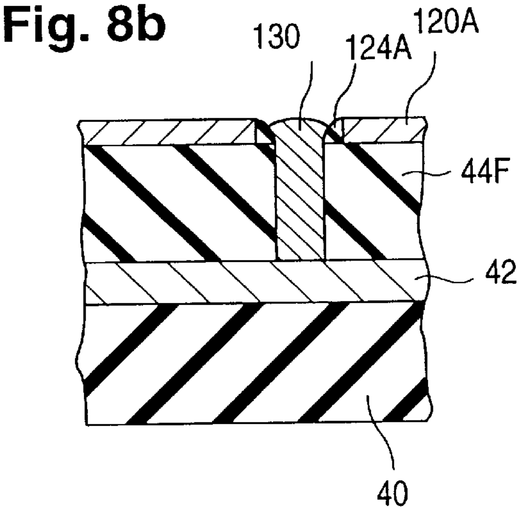

The deposition time is sufficiently long to completely fill dielectric openings 128 and to partially fill apertures 126A but not so long that each precursor electron-emissive element 130 extends laterally beyond its spacer 124A. Consequently, precursor elements 130 are laterally separated from gate layer 120A by (the thickness of) spacer portions 124A. Because spacers 124A are pictorially small in FIG. 7*h*, FIG. 8*b* presents an enlarged view of a portion of the structure of FIG. 7*h* centered on left-hand precursor element 130.

Spacer portions 124A are removed with etchant that does not significantly attack gate layer 120A. Using gate layer 120A as an etch mask, insulating layer 44F is etched through gate openings 122 in an undercutting, typically isotropic, manner to form corresponding dielectric open spaces 132 around precursor electron-emissive elements 130. See FIG. 7*i* in which item 44G is the remainder of insulating layer 44F. Dielectric open spaces 132 may extend partially or fully through insulating layer 44G. FIG. 7*i* depicts the partially through case.

An electropolishing/sharpening operation is conducted to provide precursor electron-emissive elements 130 with sharpened tips. FIG. 7*j* shows the resulting structure. Filamentary electron-emissive elements 130A are the sharpened remainders of precursor elements 130. The electropolishing/sharpening operation is again performed according to a technique of the type described in U.S. patent application Ser. No. 8/269,229 cited above.

The operations shown in FIGS. 7*i* and 7*j* can be reversed. That is, precursor elements 130 can be electropolished/sharpened to form electron-emissive filaments 130A after which dielectric open spaces 132 are formed around elements 130A. Also, open spaces 132 can be formed by an anisotropic etch so that they do not significantly undercut gate layer 120A.

In any case, with composite openings 126A/128 being vertically centered on gate openings 122, each filamentary electron-emissive element 130A is vertically centered on corresponding gate opening 122. Since each gate opening 122 is vertically centered on corresponding removed sphere 46, spherical particles 46 define the locations of filaments 130A. The lateral areas occupied by filaments 130A are controlled by the diameter of spheres 46 and the thickness of spacer layer 124. Filaments 130B can therefore be arranged to provide highly uniform electron emission at a controlled magnitude by appropriately adjusting the sphere size and surface density along with the spacer thickness.

Figure 7G:
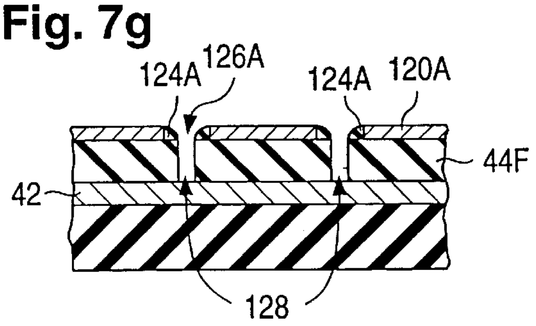
Figure 7I:
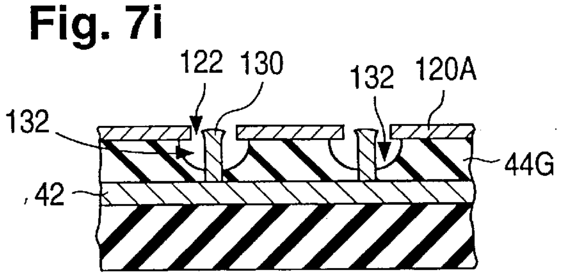
Figure 7J:
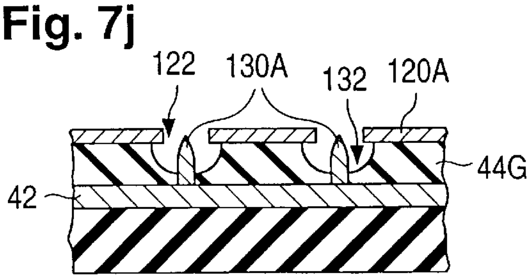
Figure 9A:
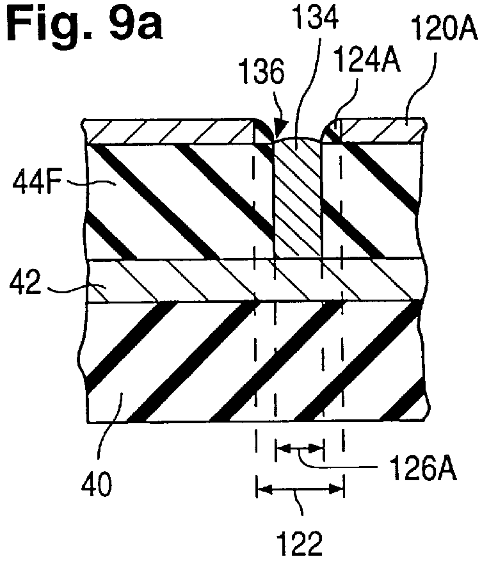
FIGS. 9a–9c are expanded cross-sectional structural views representing a set of steps that can be substituted for the steps of FIGS. 7h–7j in fabricating a gated field emitter having filamentary electron-emissive elements in accordance with the invention.
Figure 9B:
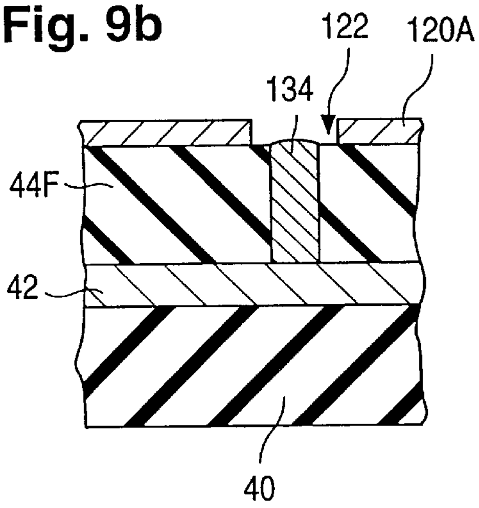
Figure 9C:
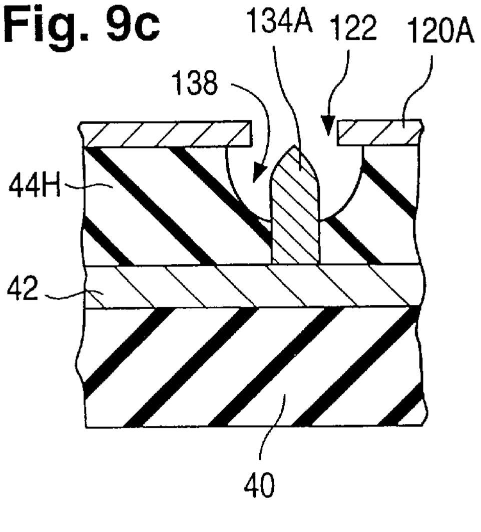

FIGS. 9*a*–9*c* (collectively "FIG. 9") illustrate an enlarged view of a process sequence that can be applied to the structure of FIG. 7*g* in fabricating a gated field-emission cathode having filamentary electron-emissive elements in accordance with the invention. In the process of FIGS. 7*a*–7*g* and FIG. 9, spacer portions 124A consist of electrically non-insulating material, normally a metal, that is selectively etchable with respect to both the emitter filament material and the gate material. For example, when (a) the gate material is chromium and (b) the filament material is nickel, the spacer material of portions 124A is typically aluminum. Also, as described more fully below in connection with FIG. 14, lower non-insulating emitter region 42 in the process sequence of FIG. 9 consists of a lower electrically conductive layer and an upper electrically resistive layer.

Starting from the structure of FIG. 7*g*, the emitter filament material is electrochemically deposited into composite apertures 126A/128 to form precursor filamentary electron-emissive elements 134. During the electrochemical deposition, gate layer 120A acts as a control electrode. Non-insulating spacers 124A contact gate layer 120A and therefore serve as part of the control electrode. A deposition anode is situated in the deposition electrolyte. Lower non-insulating emitter region 42 is the deposition cathode. Since the filament material being deposited into dielectric openings 126A contacts lower non-insulating region 42, the filament material that accumulates in apertures 126A/128 serves as part of the deposition cathode.

The lower conductive layer of lower non-insulating region 42 is maintained at a voltage sufficient to cause the emitter filament material to electrochemically accumulate in dielectric openings 126A on the upper resistive layer of non-insulating region 42. Gate layer 120A is, on the other hand, maintained at a voltage insufficient to cause the filament material to electrochemically deposit on the control electrode formed with gate layer 120A and non-insulating spacers 124A.

The accumulation of filament material in dielectric openings 126A continues until precursor electron-emissive filaments 134 touch non-insulating spacers 124A, as indicated at point 136 in FIG. 9*a*. When each precursor filament 134 touches its non-insulating spacer 124A, that filament 134 is electrically shorted to the control electrode formed with gate layer 120A and non-insulating spacers 124A. The voltage of each so-shorted filament 134 then changes from the deposition-cathode value sufficient for electrochemical deposition of the filament material to the control-electrode value insufficient for filament material deposition. Accordingly, the electrochemical deposition of that filament 134 is terminated.

When each precursor filament 134 is electrically shorted to the control electrode, control-electrode current flows through that filament 134 and the underlying portion of the upper resistive layer in lower non-insulating region 42. The combined resistance $R_D$ of each so-shorted filament 134 and the underlying portion of the upper resistive layer causes a voltage drop $V_D$ to occur across that filament 134 and the underlying portion of the lower resistive layer.

For each electrically shorted filament 134, the value of combined resistance $R_D$ is sufficiently high to cause voltage drop $V_D$ to reach a value adequate to prevent the deposition-cathode voltage of the lower conductive layer of non-insulating region 42 from being changed to a value sufficient for electrochemical deposition of the filament material. Consequently, termination of the deposition of one precursor filament 134 has little effect on the deposition of another precursor filament 134. Deposition of all of precursor filaments 134 substantially terminates as each of them independently touches its non-insulating spacer 124A. The filament material thus cannot bulge out of apertures 126A sufficiently far to cause precursor filaments 134 to bridge to gate layer 120A.

Using a suitable etchant that does not significantly attack gate layer 120A or precursor electron-emissive filaments 134, spacer portions 124 are removed to produce the structure of FIG. 9*b*. An electropolishing/sharpening operation is performed to convert precursor elements into sharpened filamentary electron-emissive elements 134A as shown in FIG. 9*c*.

With gate layer 120A serving as an etch mask, insulating layer 44 is etched through gate openings 122 in an undercutting, typically isotropic, manner to form corresponding dielectric open spaces 138 around electron-emissive filaments 134A. Item 44H in FIG. 9*c* is the remainder of insulating layer 44F. The electropolishing/sharpening operation can be performed before or after the etch to create dielectric open spaces 138. In either case, the structure of FIG. 9*c* is further processed in the manner described above.

Regardless of whether dielectric open spaces 138 are created before or after the electropolishing/sharpening operation, each filamentary electron-emissive element 134A is vertically centered on corresponding gate opening 122. Consequently, spheres 46 define the locations of electron-emissive filaments 134A. Also, spheres 46 and spacers 124A control the lateral areas occupied by filaments 134A. The uniformity and magnitude of the electron emission from filaments 134A is then controlled by appropriately varying the sphere size and surface density in combination with the spacer thickness.

The technique utilized to automatically terminate electrochemical deposition of the filament material in the process sequence of FIG. 9 can be applied to a process that includes the process sequence of FIGS. 6*a*–6*d*. In this case, annular spacer portions 110A consist of electrically non-insulating material, normally a metal, which is selectably etchable with respect to the filament and gate materials. Spacer portions 110A are also typically selectively etchable with respect to the primary material. Primary layer 72A may consist of electrically non-insulating material, again normally a metal such as aluminum, which is selectively etchable with respect to the filament and gate materials. Lower non-insulating region 42 again consists of a lower conductive layer and an upper resistive layer as described further below in connection with FIG. 14.

Beginning at the structure of FIG. 6*d*, electrochemical deposition of the emitter filament material is performed with an electrochemical cell in which gate layer 60B acts as the control electrode. Since spacer portions 110A contact gate layer 60B, spacers 110A act as part of the control electrode. With the deposition anode being situated in the deposition electrolyte, lower non-insulating emitter region 42 is the deposition cathode. The filament material being deposited into dielectric openings 114 contacts region 42 and thus serves as part of the deposition cathode.

When the filament material accumulating in each dielectric opening 114 touches corresponding spacer portion 110A, the deposition cathode for electron-emissive filament 116 being formed in that opening 114 is electrically shorted to the control electrode. This terminates the electrochemical deposition of the filament material into that opening 114. Precursor electron-emissive filaments having shapes similar to precursor filaments 134 in FIG. 9*a* are formed in dielectric openings 114.

Primary layer 72A and spacer portions 110A are subsequently removed. An electropolishing step is performed to sharpen each electron-emissive filament, and an etch is performed through gate openings 80 to create dielectric open spaces around the filaments. As in the process sequences of FIGS. 6, 7, and 9, either of these steps can be performed first. The resulting structure appears generally as shown in FIG. 6*h* or 7*j* depending on whether the dielectric open spaces extend fully or partly through insulating layer 44.

In the processes/process sequences of FIGS. 5–7, spacers are created by depositing a blanket layer of the spacer material and then removing undesired portions of the blanket layer. Spacers can, however, be formed by a selective deposition technique in certain circumstances. The requisite circumstances typically arise when the gate layer is exposed along its side edges but not along its upper or lower surface.

Figure 10A:
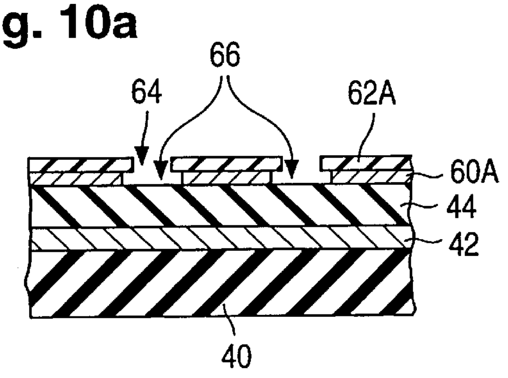
FIGS. 10a–10g are cross-sectional structural views representing a set of back-end steps by which the front-end structure of FIG. 3f (or 3e) is further processed according to the invention to produce a gated field emitter having filamentary electron-emissive elements. Alternatively, the front-end structure of FIG. 2d (or 2c), 4g1 or 4g2 can be further processed in accordance with the invention by utilizing the back-end steps of FIGS. 10a–10g to produce a gated field emitter having filamentary electron-emissive elements.
Figure 10B:
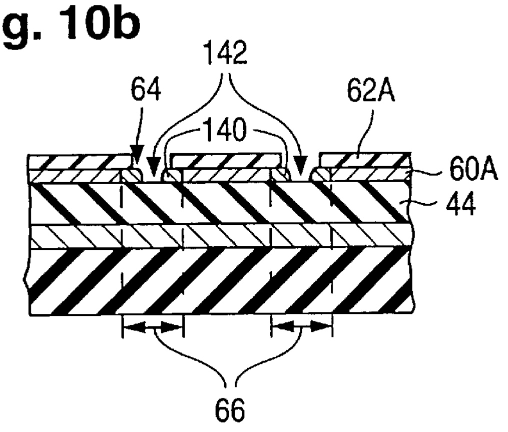

FIGS. 10*a*–10*g* (collectively "FIG. 10") depict a back-end process sequence which is applied to the front-end process sequence of FIGS. 3*a*–3*f* and which utilizes selective spacer deposition in accordance with the invention to produce a gated field-emission cathode having filamentary electron-emissive elements. As illustrated in FIG. 10*a* which repeats FIG. 3*f*, each gate opening 66 is slightly larger than corresponding primary opening 64 in the back-end process sequence of FIG. 10 so that gate opening 66 slightly undercut primary layer 62A. Nonetheless, each gate opening 66 can be a substantially the same diameter as corresponding primary opening 64. Regardless of whether gate openings 66 do, or do not, undercut primary layer 62A, only the side edges of gate layer 60A are exposed.

Using an electrochemical technique, suitably etchable electrically non-insulating spacer (or coating) material is selectively deposited on the exposed edges of gate layer 60 along gate openings 66 to form annular electrically non-insulating spacers 140. See FIG. 10*b*. Apertures 142 extend respectively through annular spacers 140. Each aperture 142 is vertically aligned to corresponding annular spacer 140. The electrochemical deposition is performed for a time sufficiently long that the diameter of each aperture 142 is considerable less than the diameter of corresponding gate opening 64.

During the electrochemical spacer deposition, gate layer 60A is the deposition cathode. Since spacers 140 contact gate layer 60A, spacers 140 form part of the cathode as they are grown along the gate edges. The deposition anode is situated in the deposition electrolyte.

Spacers 140 are selectively etchable with respect to gate layer 62A, insulating layer 44, and the material later used informing the electron-emissive filaments. The spacer material is normally a material such as copper or nicket subject to being different from the gate material and also being different from the filament material.

Figure 10C:
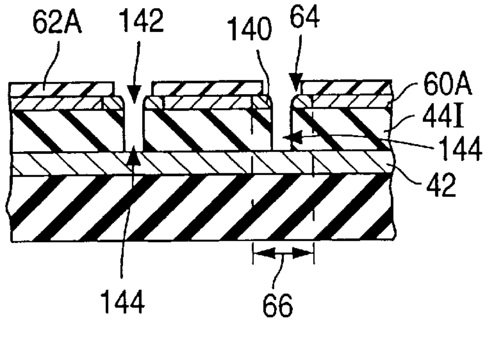
Figure 10D:
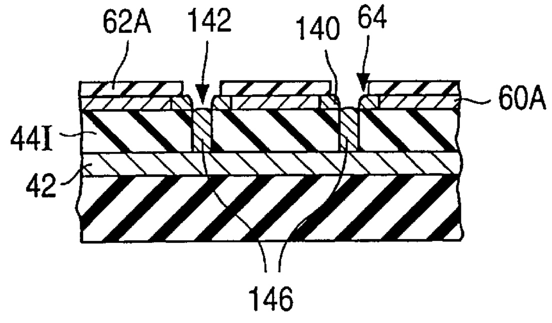

Using gate layer 62A and spacers 140 as an etch mask, insulating layer 44 is anistropically etched through gate openings 64 and apertures 142 to form corresponding dielectric openings 144 through insulating layer 44 down to lower non-insulating region 42. FIG. 10*c* shows the resultant structure. Item 44I is the remainder of insulating layer 44. The side walls of dielectric openings 144 are largely vertical. Since each aperture 142 is of smaller diameter than corresponding gate opening 64, the diameter of each dielectric opening 144 approximately equals the diameter of corresponding aperture 142.

Electrically non-insulating emitter filament material is electrochemically deposited into dielectric openings 144 to form precursor electron-emissive filaments 146 that contact lower non-insulating region 44. See FIG. 10*d*. The filament deposition is performed until precursor filaments 146 touch, or nearly touch, spacers 142. The electrochemical filament deposition is typically performed according to the techniques generally described in U.S. patent application Ser. No. 8/269,229 cited above. The filament deposition is terminated either after a selected deposition time or according to the automatic technique utilized in the process sequence of FIG. 9.

During the electrochemical filament deposition, the combination of primary layer 62A, spacers 140, and insulating layer 44I encapsulates gate layer 60A (again except possibly along the lateral periphery of the structure) to prevent precursor electron-emissive filaments 146 from touching gate layer 60A. Spacers 140 determine the lateral spacing between precursor filaments 146 and gate layer 60A. Each filament 146 is vertically centered on corresponding primary opening 64 and thus on the location of corresponding removed sphere 46.

Figure 10E:
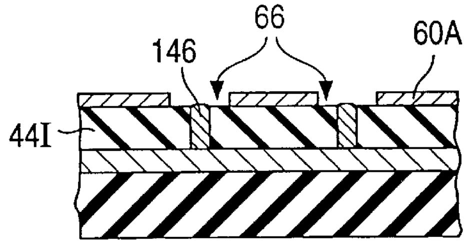

Primary layer 62A and spacers 140 are removed to produce the structure shown in FIG. 10*e*. Primary layer 62A can be removed before removing spacers 140, or vice versa. Alternatively, when an etchant that etches both the spacer and primary materials is available, primary layer 62A and spacers 140 can be removed at the same time. In any case, the removal operation is performed with etchant that does not significantly attack gate layer 60A or precursor electron-emissive filaments 146. Gate openings 66 are thereby reopened. Since each reopened gate opening 66 and corresponding dielectric opening 146 were centered on corresponding primary opening 64, each filament 146 is vertically centered on corresponding gate opening 66.

Figure 10F:
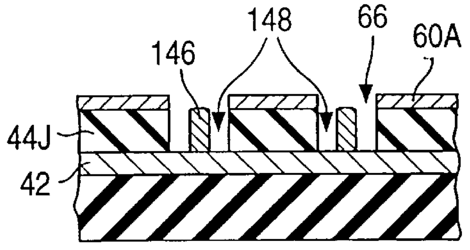
Figure 10G:
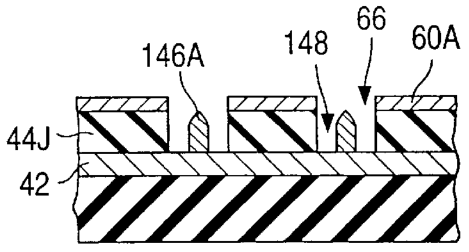

Using gate layer 60A as an etch mask, insulating layer 44I is etched through gate openings 66 to form corresponding dielectric open spaces 148 around precursor electron-emissive filaments 146 as shown in FIG. 10*f*. Item 44J is the remainder of insulating layer 44I. The etch can be performed in an isotropic manner, the situation illustrated in FIG. 10*f*. Alternatively, the etch can be performed in a partially or fully isotropic manner so that dielectric open spaces 148 undercut gate layer 60A. Open spaces 148 may extend partially or fully through insulating layer 44J. FIG. 10*f* illustrates the fully through situation.

An electropolishing/sharpening operation is performed on precursor electron-emissive filaments 146 to provide them with sharpened tips. See FIG. 10*g*. Items 146A are the sharpened remainders of precursor filaments 146. Once again, the electropolishing/sharpening operation is performed according to a technique of the type described in U.S. patent application Ser. No. 8/269,229.

The process of FIGS. 3*a*–3*f* and 10 can be modified in various ways. The front-end process sequence of FIGS. 2*a*–2*d* can be substituted for the front-end process sequence of FIGS. 3*a*–3*f*. Likewise, the front-end process sequence of FIG. 4 (either the version of FIG. 4*g*1 or the version of FIG. 4*g*2), accompanied by the removal of further layer 74A, can be substituted for the process sequence of FIGS. 3*a*–3*f*. The electropolishing/sharpening operation on precursor electron-emissive filaments 146 can be performed before creating dielectric open spaces 148.

In the final structure, each electron-emissive filament 146A is vertically centered on corresponding gate opening 66. Inasmuch as removed spheres 46 define the locations of gate openings 66, removes spheres 46 also define the locations of filaments 146A. The lateral area of each electron-emissive filament 146A is controlled by the diameter of corresponding removed sphere 46 and the lateral thickness of corresponding spacer 140. By suitable adjusting the sphere size and particle surface density along with the spacer thickness, filaments 146A can provide highly uniform electron-emission.

In the processes of FIGS. 2 and 7, gate openings 54 and 122 have been described as being present in the gate material that remains after removal of spherical particles 46. However, gate openings 54 and 122 are actually created in gate layers 48A and 120A at the same time as the gate material is deposited. Similar comments apply to primary openings 64 in the process of FIG. 3 and to further openings 76 in the process sequence of FIG. 4.

Figure 11A:
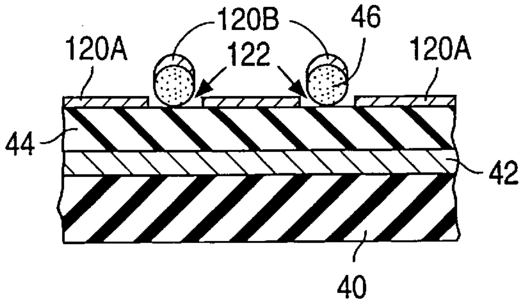
FIGS. 11a–11h are cross-sectional structural views representing a set of steps in another process according to the invention for manufacturing a gated field emitter having filamentary electron-emissive elements.

FIGS. 11*a*–11*h* (collectively “FIG. 11”) illustrate a process sequence in which spherical particles 46 are utilized to define gate openings in manufacturing a gated field-emission cathode according to the invention and in which spacer material is deposited into the gate openings before removing spheres 46. The starting point for the process sequence of FIG. 11 is structure 40/42/44 of FIG. 7*a*. Spheres 46 are deposited on top of insulating layer 44 as shown in FIG. 7*b* after which the gate material deposition is performed in a direction generally perpendicular to the upper surface of layer 44 to form gate layer 120A and excess gate material portions 120B. This results in the structure of FIG. 7*c*, repeated here as FIG. 11*a*. Gate openings 122 in gate layer 120 are expressly marked in FIG. 11*a*. The gate layer thickness in FIG. 11*a* is typically less than the gate layer thickness in the fabrication process of FIG. 7.

Figure 11B:
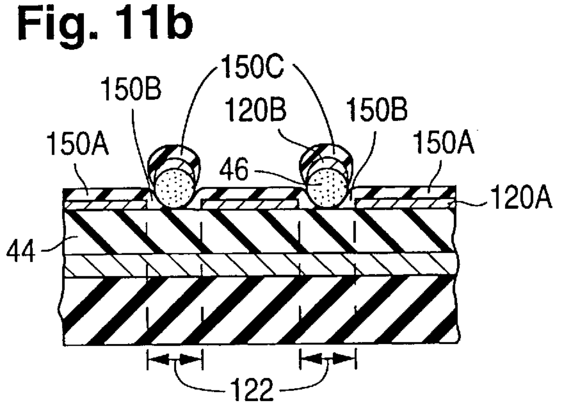
Figure 11C:
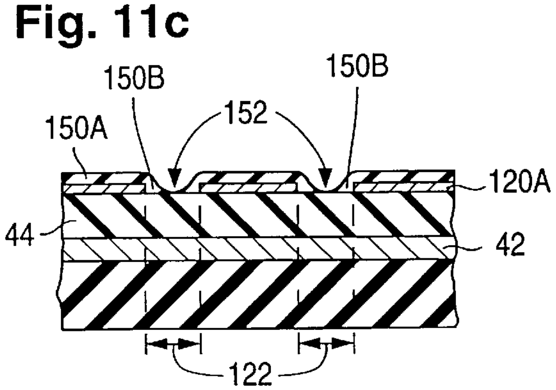
Figure 11D:
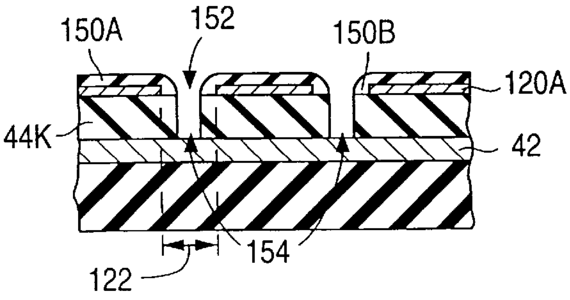

Suitably etchable spacer material, typically an electrical insulator, is deposited on top of the structure to form a spacer (or cover) layer 150A on gate layer 120A as indicated in FIG. 11*b*. Spacer layer 150A is situated in the space between spheres 46. The spacer material deposition is performed in such a way that annular portions 150B of spacer layer 150A are formed in gate openings 122 on insulating layer 44 below particles 46. Portions 150C of the spacer material accumulate simultaneously on gate material portions 120B situated on spheres 46. To avoid having excess spacer material portions 150C bridge to spacer layer 150A, the total thickness of layers 150A and 120A is normally less than the average radius of spheres 46.

The spacer material deposition is typically performed by a uniform non-collimated technique such as non-collimated sputtering (i.e., sputtering in which there is a substantial spread in the natural incident angle of the impinging atoms of the material being sputtered) or plasma-enhanced CVD. During non-collimated sputtering, the pressure is normally 10–100 millitorr. The non-collimated spacer material deposition can also be performed by an angled rotational technique such as angled rotational sputtering or angled rotational evaporation. In angled rotational deposition, the spacer material is deposited on insulating layer 44 at an angle considerably less than 90° relative to the upper surface of insulating layer 44 while rotating structure 40/42/44, relative to the source of the spacer material, about an axis generally perpendicular to the upper surface of layer 44. Although atoms of the impinging spacer material may instantaneously form a collimated beam during the angled rotational deposition, the angled rotation of structure 40/42/44 relative to the spacer material source causes the overall deposition to be non-collimated.

When the spacer material deposition is performed in a uniform non-collimated manner into the space below particles 46, the lateral thickness of annular spacer portions 150B—i.e., the radial distance that spacer layer 150A extends into the area vertically shadowed by spheres 46—can readily equal 20–80% of the average sphere radius and is typically slightly more than 50% of the average sphere radius.

Particles 46 are removed, again typically according to the technique utilized in the process of FIG. 2. During the removal of spheres 46, excess gate material portions 120B and excess spacer material portions 150C are simultaneously removed to produce the structure of FIG. 11*c*. Apertures 152 now extend through spacer layer 150A at the locations of removed spheres 46. Specifically, apertures 152 extend through annular spacer portions 150B situated in gate openings 122. Since particles 46 are largely spherical, apertures 152 are largely circular. Each aperture 152 is vertically centered on corresponding gate opening 122.

Using spacer layer 150A as an etch mask, insulating layer 44 is anisotropically etched through apertures 152 to form corresponding dielectric openings 154 through layer 44 down to lower non-insulating region 42. See FIG. 11*d* in which item 44K is the remainder of insulating layer 44. Because apertures 152 are centered on gate openings 122, each dielectric opening 154 is vertically centered on corresponding gate opening 122.

Figure 11E:
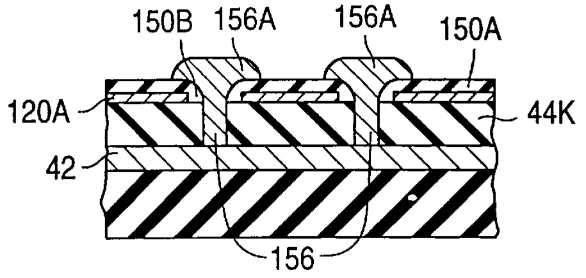
Figure 11F:
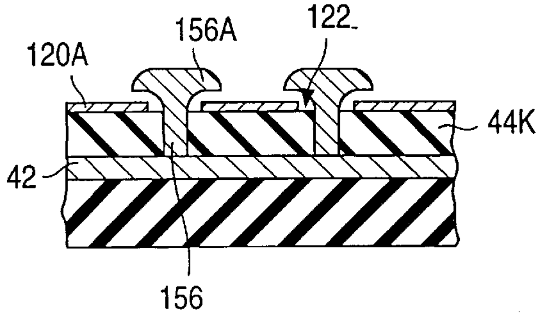

Electrically non-insulating emitter filament material is electrochemically deposited into composite openings (or apertures) 152/154 to form precursor filamentary electron-emissive elements 156 that contact lower non-insulating emitter region 42. FIG. 11*e* shows the resultant structure. Once again, the electrochemical filament deposition is typically performed in the manner generally described in U.S. patent application Ser. No. 8/269,229. Likewise, the emitter filament material is normally a metal such as nickel or platinum.

During the electrochemical filament deposition, the combination of insulating layer 44 and spacer layer 150A, including spacer portions 150B, encapsulates gate layer 120A (again except possibly along the lateral periphery of the structure) to prevent precursor electron-emissive filaments 156 from contacting gate layer 120A. Spacers 150B determine the lateral spacing between gate layer 120A and precursor filaments 156.

The electrochemical deposition is typically conducted for a time sufficiently long to overfill composite openings 152/154 but not long enough for electron-emissive filaments 156 to meet one another along the top of spacer layer 158. Consequently, each electron-emissive filament 156 has a cap portion 156A that protrudes out of composite opening 152/154. The overfilling again reduces the likelihood of creating electron-emissive filaments of significantly different type due to differences in the nucleation and growth of the filament material.

Spacer layer 150A, including spacer portions 150B, is removed. See FIG. 11*f*. The spacer material removal is preferably done with etchant that does not significantly attack either insulating layer 44K or gate layer 120A. As a result, the outer portions of gate openings 122 are re-opened. A wet chemical, or a plasma having an isotropic component, is typically used to perform the spacer material etch.

Figure 11G:
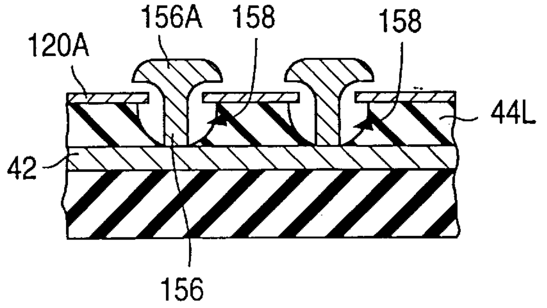

Using gate layer 120A as an etch mask, insulating layer 44K is etched through gate openings 122 in an undercutting, typically isotropic, manner to form corresponding dielectric open spaces 158 around electron-emissive filaments 156. See FIG. 11*g*. Item 44L is the remainder of insulating layer 44K. Dielectric open spaces 158 may extend partially or fully through insulating layer 44L. FIG. 11*g* illustrates the fully through case.

Figure 11H:
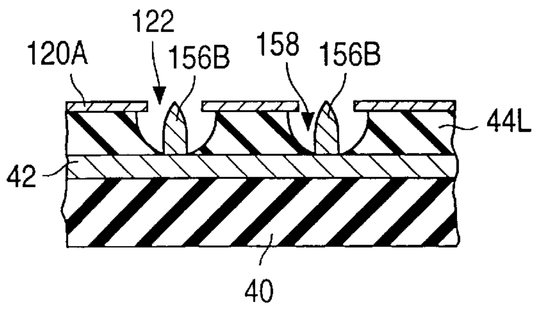

Precursor electron-emissive filaments 156 are processed to remove caps 156A and provide the remaining filamentary portions with sharpened tips that extend at least partially through gate openings 122. FIG. 11*h* shows the resultant structure in which sharpened electron-emissive filaments 156B are the remainders of filaments 156. Sharpened filaments 156B are typically created from precursor filaments 156 by the electropolishing/sharpening technique described above for creating sharpened filaments 116B in the process sequence of FIG. 5. Each electron-emissive filament 156B is thus vertically centered on corresponding gate opening 122.

The electropolishing/sharpening operation can be done after creating dielectric open spaces 158. The structure of FIG. 11*h* is again produced. Also, an anisotropic etch can be used to form open spaces 158 so that they do not significantly undercut gate layer 120A. Alternatively, the formation of open spaces 158 can be deleted. The technique employed in the process sequence of FIG. 9 to automatically terminate the electrochemical deposition of the filament material can be applied to the process of FIG. 11 in the same way that the filament deposition is automatically terminated in the process sequence of FIG. 9.

Inasmuch as (a) electron-emissive filaments 156B are vertically centered on gate openings 122 and (b) openings 122 are centered on removed spheres 46, the locations of filaments 156B are determined by spheres 46. The lateral area of filaments 156B is controlled by the diameter of spheres 46 and the lateral thickness of spacer portions 150B. Consequently, filaments 156B can provide highly uniform electron emission by suitably adjusting the sphere size, the sphere surface density, and the lateral thickness of spacers 150B.

The processes/process sequences of FIGS. 5–7, 10, and 11 for manufacturing electron emitters having filamentary electron-emissive elements all entail depositing spacer material into the gate openings. However, gated electron emitters having electron-emissive filaments whose average diameter is considerably less than the average diameter of spheres 46 that define the filament locations can be fabricated without depositing spacer material into gate openings. FIGS. 12*a*–12*i* (collectively "FIG. 12") present an example of how a gated field-emission cathode is so manufactured in accordance with the invention.

In the process of FIG. 12, initial structure 40/42/44 is formed in substantially the same way as described above for the process of FIG. 2. See FIG. 12*a*which repeats FIG. 2*a*. Solid spherical particles 46 are likewise distributed across the top of insulating layer 44 according to the random, or largely random, technique utilized in the process of FIG. 2. FIG. 12*b*, which repeats FIG. 2*b*, illustrates the structure at this point.

Figure 12A:
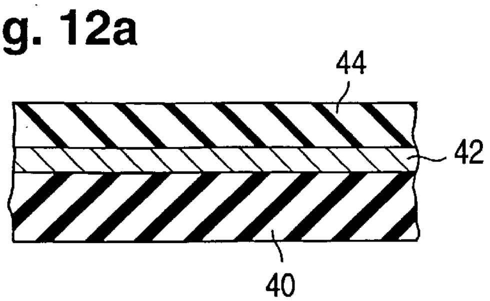
FIGS. 12a–12i are cross-sectional structural views representing a set of steps in a further process according to the invention for manufacturing a gated field emitter having filamentary electron-emissive elements.
Figure 12B:
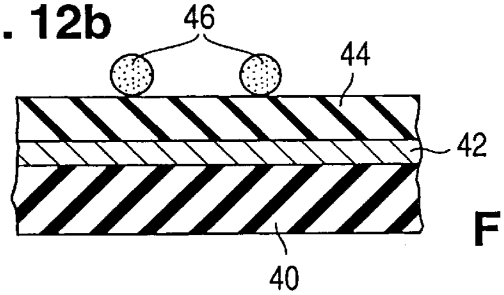
Figure 12C:
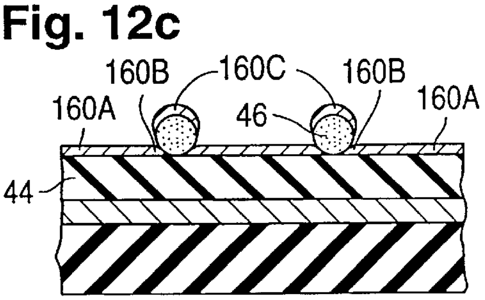
Figure 12D:
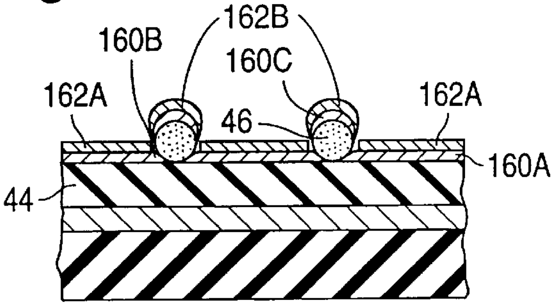
Figure 12E:
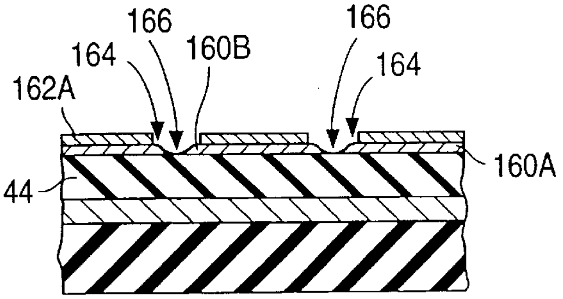
Figure 12F:
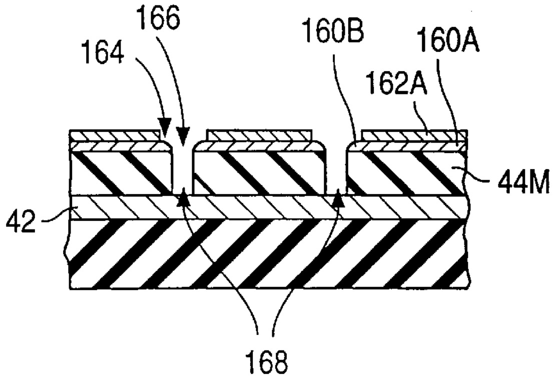
Figure 12G:
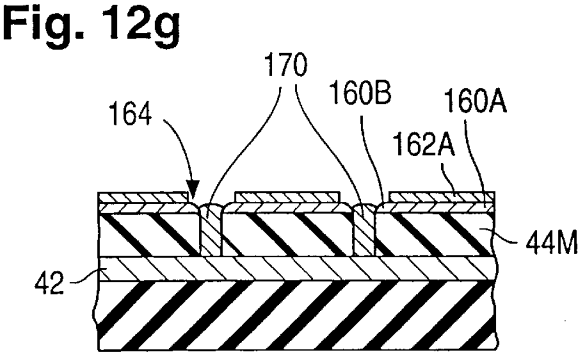

Lower (or first) cover material is deposited on top of the structure to form a lower cover layer 160A on insulating layer 44 as shown in FIG. 12*c*. Lower cover layer 160A is located in the space between particles 44. The deposition of cover layer 160A is performed in such a way that annular portions 160B of cover layer 160A are formed in the spaces below spheres 46 above layer 44. Portions 160C of the lower cover material accumulate simultaneously on the upper halves of spheres 46.

The deposition of the lower cover material is typically performed in substantially the same way as the spacer material deposition in the process of FIG. 11. The lower cover material is typically an electrical insulator. Alternatively, the lower cover material can be an electrical non-insulator, typically a metal such as chromium, nickel, molybdenum, titanium, or tungsten. In this case, part of cover layer 160A later forms part of the gate layer.

Upper (or second) cover material is deposited on top of the structure in a direction substantially perpendicular to the upper surface of insulating layer 44 to form an upper cover layer 162A on lower cover layer 160A in the space between spherical particles 46. See FIG. 12*d*. Very little (essentially none) of the upper cover material accumulates in the spaces below spheres 46 above lower cover material portions 160B. However, portions 162B of the upper cover material simultaneously accumulate on lower cover portions 160C. The total thickness of cover layers 160A and 162A is normally less than the average radius of spheres 46. This avoids having excess cover material portions 162B bridge to cover layer 162A.

Upper cover layer 162A normally forms at least part of the gate layer for the electron emitter. In that case, the upper cover material consists of electrically non-insulating gate material, typically a metal such as chromium, nickel, molybdenum, titanium, tungsten, or gold. Alternatively, the upper cover material can be an electrical insulator if lower cover layer 160A later becomes the gate layer.

Spherical particles 46 are now removed, once again typically according to the technique employed in the process of FIG. 2. In removing spheres 46, excess cover material portions 160C and 162B are simultaneously removed to produce the structure of FIG. 12*e*. Upper openings 164, which typically constitute gate openings, extend through upper cover layer 162A at the locations of removed spheres 46. Lower openings 166 similarly extend through lower cover layer 160A, specifically through cover portions 160B of layer 160A, at the locations of removed spheres 46. Each lower cover opening 166 is of smaller diameter than corresponding upper cover opening 164. Since particles 46 are largely spherical, both cover openings 164 and cover openings 166 are largely circular. Each lower opening 166 is centered on corresponding upper opening 164.

Using cover layers 160A and 162A as an etch mask, insulating layer 44 is anisotropically etched through cover openings 164 and 166 to form corresponding dielectric openings 168 through layer 44 down to lower non-insulating emitter region 42. See FIG. 12*f*. Item 44M is the remainder of insulating layer 44. Since each lower cover opening 166 is smaller than corresponding upper cover opening 164, the diameter of each dielectric opening 168 approximately equals the diameter of corresponding lower cover opening 166. Also, each dielectric opening 168 is vertically centered on corresponding cover opening 164.

Electrically non-insulating emitter filament material is electrochemically deposited into composite openings (or apertures) 166/168 to form precursor electron-emissive filaments 170 that contact lower non-insulating emitter region 42. See FIG. 12*g*. The deposition time is sufficiently long to completely fill dielectric openings 168 but not so long that any of filaments 170 contact upper cover layer 162A. The filament deposition can be terminated automatically in the manner described above for the process sequence of FIG. 9. Once again, the filament material normally is a metal such as nickel or platinum.

Figure 12H:
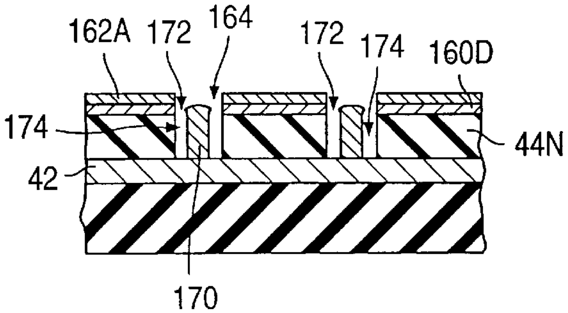

Using upper cover 162A as an etch mask, lower cover layer 160A is etched through upper cover openings 164 to remove annular cover portions 160B. Lower cover openings 166 are thereby widened to become lower cover openings 172 as shown in FIG. 12*h*. Item 160D is the remainder of lower cover layer 160A. The etch is typically performed in an anisotropic manner so that widened lower cover openings 172 do not undercut upper cover layer 162A.

Using cover layers 162A and 160D as an etch mask, insulating layer 44M is anisotropically etched through cover openings 164 and 172 to form corresponding dielectric open spaces 174 down to lower non-insulating region 42. Again, see FIG. 12*h*. Item 44N is the remainder of insulating layer 44M. Dielectric open spaces 174 may extend partially or fully through insulating layer 44N, FIG. 12*h* depicting the fully through case.

Figure 12I:
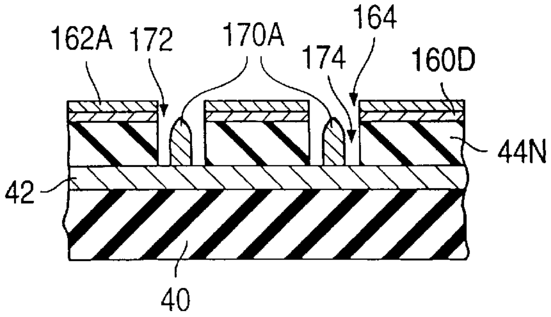

An electropolishing/sharpening operation is performed on precursor filaments 170 to provide them with sharpened tips that extend partially through lower cover openings 172. The resultant structure is shown in FIG. 12*i*. Electron-emissive filaments 170A are the sharpened remainders of precursor filaments 170. The electropolishing/sharpening operation is typically conducted in the manner described above for the process of FIG. 5.

In FIG. 12*i*, upper cover layer 162A is normally the gate layer. Alternatively, both upper cover layer 162A and lower cover layer 160D can serve together as the gate layer. As yet another alternative, lower cover layer 160D can be the gate layer. In this case, upper cover layer 162A typically consists either of electrically insulating material or is removed.

The electropolishing/sharpening operation can be done before creating dielectric open spaces 174. An etch having an isotropic component can be used to form open spaces 174 so that they undercut cover layers 160D and 162A. The formation of open spaces 174 can be deleted. Sharpened filaments 170A then laterally abut insulating layer 44M.

Regardless of how, when, and if dielectric open spaces 174 are created and regardless of whether the gate layer is formed with one or both of cover layers 162A and 160D, each electron-emissive filament 170A is vertically centered on both corresponding upper cover opening 164 and corresponding lower cover opening 172. Since upper cover openings 164 are situated at the locations of removed spheres 46, the locations of filaments 170A are determined by spheres 46. The lateral area occupied by filaments 170A is controlled by the diameter of spheres 46 and the lateral width of annular cover material portions 160B. Appropriately adjusting the sphere size, the sphere surface density, and the lateral thickness of annular cover portions 160B enables the electron emitter of FIG. 12*i*to achieve highly uniform electron emission.

In the foregoing processes/process sequences, spherical particles 46 are utilized to directly define gate openings or to directly define openings utilized to define gate openings. Particles 46 can, however, be employed to first define solid regions that have the desired lateral shapes for the gate openings. These solid regions, normally circular, are then used to define the gate openings.

FIGS. 13*a*–13*g* (collectively "FIG. 13") illustrate an example of the front-end portion of such a fabrication process in which the gate openings for a gated field-emission cathode are created from solid regions whose shapes are defined by spherical particles 46 in accordance with the invention. The so-created gate openings normally have abrupt edges. Consequently, the front-end process sequence of FIG. 13 is particularly suitable for being completed according to a back-end process sequence, such as that of FIGS. 7*e*–7*j*, in which formation of the electron-emissive elements entails providing spacer material in the gate openings. The process sequence of FIG. 13 begins with structure 40/42/44 of FIG. 2*a*, repeated here as FIG. 13*a*.

Figure 13A:
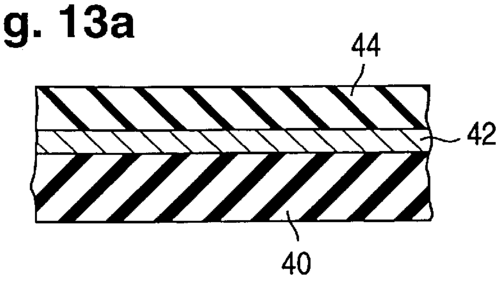
FIGS. 13a–13g are cross-sectional structural views representing a set of front-end steps in a process for manufacturing a gated field emitter according to the invention. The front-end process sequence of FIGS. 13a–13g can, for example, be completed according to the back-end process sequence of FIGS. 7e–7j.
Figure 13B:
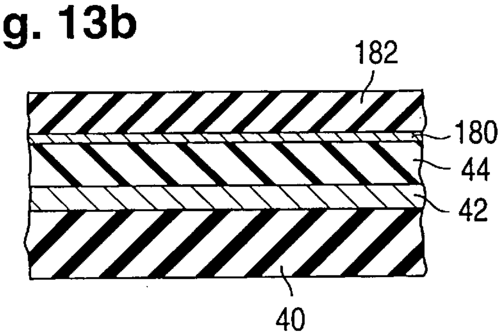

An electrically non-insulating intermediate layer 180, which later serves as a lower part of the gate layer, is deposited on insulating layer 44 as shown in FIG. 13*b*. Intermediate non-insulating layer 180 typically consists of a metal such as chromium or titanium. A pattern-transfer layer 182 is formed on intermediate layer 180. Pattern-transfer layer 182 may consist of various materials such as photoresist or inorganic dielectric material.

Figure 13C:
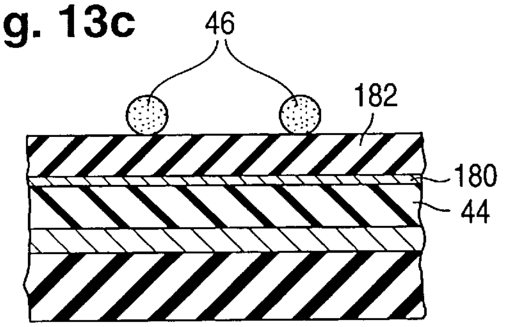
Figure 13D:
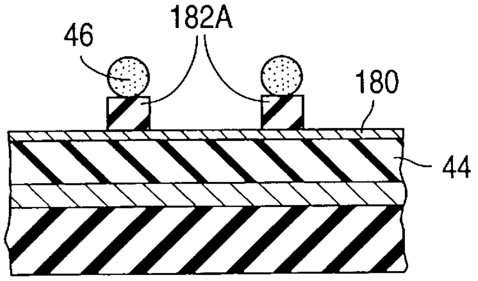

Particles 46 are distributed across the upper surface of pattern-transfer layer 182 using the random, or largely random, technique described above for the process of FIG. 2. FIG. 13*c* illustrates the structure at this point. The portion of pattern-transfer layer 182 not shadowed—i.e., not vertically covered—by particles 46 is removed as shown in FIG. 13*d*. Generally circular pedestals 182A are thereby formed as the remainder of layer 182. Each pedestal 182A underlies a corresponding one of particles 46.

When pattern-transfer layer 182 consists of photoresist, layer 182 is exposed to actinic radiation, typically ultraviolet light, using spherical particles 46 as an exposure mask to prevent the photoresist portions below particles 46 from being subjected to the actinic radiation. The exposed photoresist changes chemical composition. A development operation is then performed on the structure to remove the exposed photoresist, leading to the structure depicted in FIG. 13*d*. When layer 182 exists of inorganic dielectric material, on anisotropic etch is performed on layer 182 in a direction generally perpendicular to the upper surface of insulating layer 44 using particles 46 as an etch mask. The non-shadowed portion of layer 182 is removed during the etch, again leading to the structure of FIG. 13*d*.

Figure 13E:
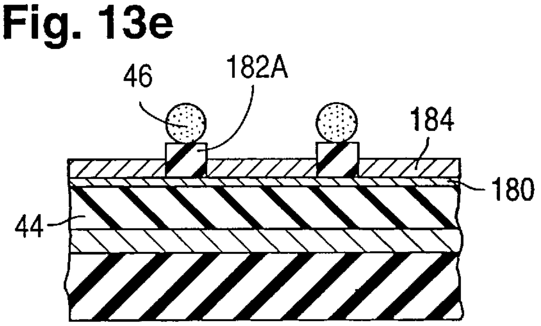

Electrically non-insulating gate material is deposited on top of the structure. The gate material deposition is preferably done by an electrochemical technique using non-insulating intermediate layer 180 as the deposition cathode. A deposition anode is situated in the deposition electrolyte above particles 46. During the electrochemical deposition, gate material accumulates on the exposed part of intermediate layer 180 to form an electrically non-insulating upper gate sublayer 184 as depicted in FIG. 13*e*.

Figure 13F:
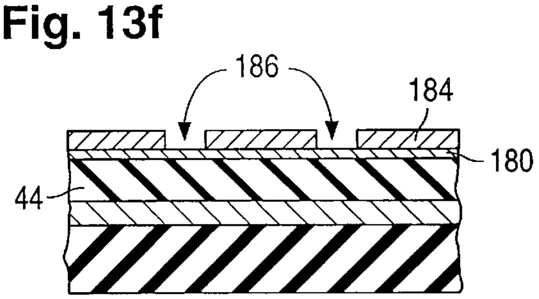

Pedestals 182A and particles 46 are removed to produce the structure of FIG. 13*f*. Upper gate openings 186 extend through upper gate sublayer 184 at the locations of removed pedestals 182A below particles 46. The removal of pedestals 182A and particles 46 can be performed in various ways. For example, pedestals 182A can be removed with a suitable chemical or plasma etchant, thereby simultaneously removing particles 46. Alternatively, particles 46 can be removed after which pedestals 182A are removed Using upper gate sublayer 184 as an etch mask, non-insulating intermediate layer 180 is anisotropically etched through upper gate openings 186 to form corresponding intermediate openings 188 through intermediate layer 180 down to insulating layer 44. See FIG. 13*g*. Each intermediate opening 188 is vertically concentric with, and of substantially the same diameter as, overlying upper gate opening 186. The remainder 180A of intermediate layer 180 is now a lower gate sublayer, intermediate openings 188 thereby being lower gate openings. Accordingly, gate sublayers 180A and 184 constitute a composite gate layer in which each pair of corresponding gate openings 186 and 188 forms a composite gate opening.

Figure 13G:
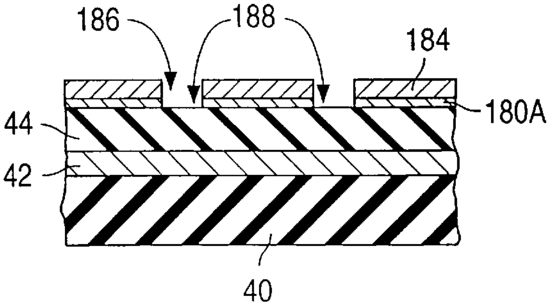

Aside from the fact that the gate layer in the structure of FIG. 13*g* consists of sublayers 180A and 184 and except for associated labeling differences, the structure of FIG. 13*g* is substantially the same as the structure of FIG. 7*d*. Items 180A/184 and 186/188 in FIG. 13*g* respectively correspond to items 120A and 122 in FIG. 1*d*. Subject to these labeling differences, the structure of FIG. 13*g* can now be completed according to the spacer-based back-end process sequence of FIGS. 7*e*–7*j*.

Alternatively, using gate layer 180A/184 as an etch mask, insulating layer 44 can be etched through gate openings 186/188 to form corresponding dielectric open spaces through layer 44 down to lower non-insulating region 42. Spacer material, typically an electrical insulator, can be conformally deposited on top of the structure and into the dielectric open spaces so as to leave depressions, similar to depressions 104 in FIG. 5*c*, in the spacer material in the dielectric open spaces. Spacer material at the bottoms of the dielectric open spaces is removed to convert the depressions into apertures that extend down to non-insulating region 42 after which filamentary-electron-emission elements are formed in the apertures. By appropriately adjusting the sphere size, the sphere surface density, and the thickness of the spacer material, the resultant electron-emitting device can provide highly uniform electron emission.

In each of the electron emitters that have filamentary electron-emissive elements such as filaments 106B, 116B, 130A, 134A, 146A, 156B, or 170A, the gate layer such as gate layer 60s, 120A, or 162A may be patterned into column electrode lines running perpendicular to the emitter row electrodes of lower non-insulating region 42 in the same manner that the gate layer is patterned in the above-mentioned processes that yield conical electron-emissive elements. With suitable patterning being applied to the gate layer of each field emitter that has electron-emissive filaments, the field emitter may alternatively be provided with separate column electrodes that contact portions of the gate layer and run perpendicular to the row electrodes as described above for the electron emitters having electron-emissive cones.

Electron-emissive elements 106B, 116B, 130A, 134A, 146A, 156B, and 170A are true filaments for which the ratio of length to maximum diameter is at least 2 and normally at least 3. The length-to-maximum-diameter ratio is preferably 5 or more. The portions of filaments 106B, 116B, 130A, 134A, 146A, 156B, and 170A below their tips are typically cylinders of circular transverse cross-sections. Nonetheless, the transverse cross-section can be slightly non-circular. In any case, the ratio of maximum diameter to minimum diameter for each filament 106B, 116B, 130A, 134A, 146A, 156B, or 170A is usually no more than 2.

Variations and Exemplary Applications

FIG. 14 illustrates the starting point for manufacturing implementations of the present field emitter in which lower non-insulating emitter region 42 consists of an electrically conductive layer 42A situated under an electrically resistive layer 42B. Conductive layer 42A normally consists of a metal such as nickel or chromium. Resistive layer 42B is typically formed with cermet, lightly doped polycrystalline silicon, or a silicon-carbon-nitrogen compound.

When conductive layer 42A is patterned into a number of parallel emitter row electrodes, resistive layer 42B may be patterned into the same number of resistive lines, each overlying a corresponding one of the row electrodes. Alternatively, resistive layer 42B may be a blanket (continuous) layer even though conductive layer 42A is patterned into parallel lines.

FIGS. 15.1 and 15.2 respectively depict how the final structures of FIGS. 2*g* and 5*g* appear when lower non-insulating region 42 consists of conductive layer 42A and resistive layer 42B. The lower ends of electron-emissive elements 58A and 106B contact resistive layer 42B. The resistance between each electron-emissive element and conductive layer 42A is at least $10^6$ ohms, typically $10^8$ ohms or more.

FIG. 16 depicts a typical example of the core active region of a flat-panel CRT display that employs an area field emitter manufactured according to the invention. Substrate 40 forms the backplate for the CRT display. Lower non-insulating region 42 is situated along the interior surface of backplate 40 and here consists of conductive layer 42A and overlying resistive layer 42B. Conductive layer 42A is divided into emitter-electrode lines (row electrodes) extending laterally parallel to the plane of FIG. 16.

A group of column electrodes 190, one of which is depicted in FIG. 16, are situated on the gate layer, here shown, for example, as gate layer 60B in the field emitter of FIG. 5*g*. Column electrodes 190 run perpendicular to the plane of FIG. 16. Column-electrode openings 192, one of which is likewise shown in FIG. 16, extend through column electrodes 190 down to the gate layer. Each column-electrode opening 192 exposes a multiplicity of the electron-emissive elements, here shown as electron-emissive filaments 106B in the field emitter of FIG. 5*g*.

A transparent, typically glass, faceplate 194 is located across from baseplate 40. Light-emitting phosphor regions 196, one of which is shown in FIG. 16, are situated on the interior surface of faceplate 194 directly across from corresponding column-electrode openings 192. A thin electrically conductive light-reflective layer 198, typically aluminum, overlies phosphor regions 196 along the interior surface of faceplate 194. Electrons emitted by the electron-emissive elements pass through light-reflective layer 198 and cause phosphor regions 196 to emit light that produces an image visible on the exterior surface of faceplate 194.

The core active region of the flat-panel CRT display typically includes other components not shown in FIG. 16. For example, a black matrix situated along the interior surface of faceplate 194 typically surrounds each phosphor region 196 to laterally separate it from other phosphor regions 196. Focusing ridges provided over the interelectrode dielectric layer help control the electron trajectories. Spacer walls are utilized to maintain a relatively constant spacing between backplate 40 and faceplate 194.

When incorporated into a flat-panel display of the type illustrated in FIG. 16, a field emitter manufactured according to the invention operates in the following way. Light-reflective layer 198 serves as an anode for the field-emission cathode. The anode is maintained at high positive voltage relative to the gate and emitter lines.

When a suitable voltage is applied between (a) a selected one of the emitter row electrodes in lower non-insulating emitter region 42 and (b) a selected one of the column electrodes that are formed with or contact portions of the gate layer, the so-selected gate portion extracts electrons from the electron-emissive elements at the intersection of the two selected electrodes and controls the magnitude of the resulting electron current. Desired levels of electron emission typically occur when the applied gate-to-emitter parallel-plate electric field reaches 20 volt $5/\mu$m or less at a current density of 1 mA/cm$^2$ as measured at the phosphor-coated faceplate of the flat-panel display when phosphor regions 196 are high-voltage phosphors. Upon being hit by the extracted electrons, the phosphor regions emit light.

Directional terms such as "upper", "lower", "down", and the like have been employed in describing the present invention to establish a frame of reference by which the reader can more easily understand how the various parts of the invention fit together. In actual practice, the components of an electron-emitting device may be situated at orientations different from that implied by the directional terms used here. The same applies to the way in which the fabrication steps are performed in the invention. Inasmuch as directional terms are used for convenience to facilitate the description, the invention encompasses implementations in which the orientations differ from those strictly covered by the directional terms employed here.

While the invention has been described with reference to particular embodiments, this description is solely for the purpose of illustration and is not to be construed as limiting the scope of the invention claimed below. For example, when spherical particles 46 consist of glass rather than polystyrene, higher processing temperatures can be employed during the steps extending from the deposition of particles 46 to their removal. The distribution of particles 46 across the interelectrode dielectric layer, the gate layer, or the primary layer can be performed electrophoretically or dielectrophoretically, typically according to the techniques described in Haven et al, co-filed U.S. patent application Ser. No. 08/660,535, attorney docket No. M-3786 US now U.S. Pat. No. 5,755,944. An electropolishing operation can be conducted to round the edges of the gate layer at the gate openings.

One or more thin intermediate layers that perform various functions may be provided between insulating layer 44 and the gate layer. Such an intermediate layer may provide an adhesion function—i.e., the intermediate layer adheres well to both interelectrode dielectric 44 and the gate layer when the gate material does not itself adhere well to the interelectrode dielectric material. The intermediate layer is then subjected to processing steps akin to those applied to the gate layer, including the formation of intermediate openings corresponding to the gate openings.

A transparent electrically non-insulating layer situated between faceplate 194 and phosphors 196 and consisting, for example, of indium-tin oxide can be used as the anode in place of light-reflective layer 198. Substrate 40 can be deleted if lower non-insulating region 42 is a continuous layer of sufficient thickness to support the structure. Insulating substrate 40 can be replaced with a composite substrate in which a thin insulating layer overlies a relatively thick non-insulating layer that furnishes structural support.

In manufacturing large-area gated electron emitters, substrate 40 may be in the shape of a rectangular plate rather than a circular wafer which, after the formation of the electron-emissive elements, is cut into one or more rectangular plates. The electron-emissive elements can have shapes other than cones and filaments.

After creating a structure in which gate openings extend through a gate layer down to insulating layer 44 above lower non-insulating emitter region 42, the thickness of the gate layer can be increased by selectively depositing further electrically non-insulating gate material on the gate layer. The further gate material deposition can be performed by an electrochemical technique. In general, the further gate material deposition can be performed before or after removing particles 46.

The deposition termination technique described in conjunction with FIG. 9 can be employed to automatically terminate the electrochemical deposition of electron-emissive filaments in area electron emitters where the filament locations are defined by mechanisms not involving spheres 46. For example, the automatic termination technique of FIG. 9 could be applied to filaments deposited in openings created by photolithographic etching techniques or in openings defined by charged-particle tracks as in Macaulay et al, U.S. Pat. No. 5,462,467.

The area electron emitters produced according to the manufacturing processes of the invention can be employed to make flat-panel devices other than flat-panel CRT displays. In particular, the present electron emitters can be used in general vacuum environments that require gated electron sources. Various modifications and applications may thus be made by those skilled in the art without departing from the true scope and spirit of the invention as defined in the appended claims.

We claim:

1. A method comprising the steps of:

distributing a multiplicity of particles over a structure;

utilizing the particles to define corresponding locations for (a) a like multiplicity of primary openings extending through a primary layer provided over an electrically non-insulating gate layer formed over an electrically insulating layer in the structure and (b) a like multiplicity of corresponding gate openings extending through the gate layer such that each gate opening is vertically aligned to the corresponding primary opening;

etching the insulating layer through the primary openings and the gate openings to form corresponding dielectric openings substantially through the insulating layer down to a lower electrically non-insulating region provided below the insulating layer;

depositing electrically non-insulating emitter material over the primary layer, through the primary and gate openings, and into the dielectric openings to form corresponding electron-emissive elements over the lower non-insulating region; and removing the primary layer so as to substantially remove any of the emitter material accumulated over the primary layer.

2. A method as in claim 1 wherein the particles are largely spherical.

3. A method as in claim 1 wherein the primary layer comprises inorganic dielectric material.

4. A method as in claim 3 wherein the inorganic dielectric material comprises at least one of silicon nitride, aluminum oxide, and silicon oxide.

5. A method as in claim 1 wherein each primary opening is laterally substantially no larger than the corresponding gate opening.

6. A method as in claim 1 wherein the electron-emissive elements are of substantially the same size.

7. A method as in claim 1 wherein the electron-emissive elements operate in field-emission mode.

8. A method as in claim 1 wherein the emitter-material depositing step entails depositing the emitter material under conditions that enable the emitter material to accumulate in the dielectric openings generally in the shape of cones pointing away from the lower non-insulating region.

9. A method as in claim 1 wherein the distributing step entails depositing the particles directly over one of the insulating layer, the gate layer, and the primary layer.

10. A method as in claim 1 wherein the distributing step entails distributing the particles over the insulating layer, the utilizing step comprising:

providing electrically non-insulating gate material over the insulating layer at least in space between the particles;

providing primary material over the gate material at least in space between the particles; and removing the particles and substantially any material overlying the particle such that (a) the remaining primary material forms the primary layer with the primary openings extending therethrough and (b) the remaining gate material forms the gate layer with the gate openings extending therethrough.

11. A method as in claim 10 wherein the gate material comprises metal through which it is difficult to accurately etch small openings.

12. A method as in claim 10 wherein the gate material comprises gold.

13. A method as in claim 1 wherein the distributing step entails distributing the particles over the gate layer, the utilizing step comprising:

providing primary material over the gate layer at least in space between the particles;

removing the particles and substantially any material overlying the particles such that the remaining primary material forms the primary layer with the primary openings extending therethrough; and etching the gate layer through the primary openings to form the gate openings.

14. A method as in claim 1 wherein the distributing step entails distributing the particles over the primary layer, the utilizing step comprising:

providing further material over the primary layer at least in space between the particles;

removing the particles and substantially any material overlying the particles such that further openings extend through the remaining further material at the locations of the so-removed particles;

etching the primary layer through the further openings to form the primary openings; and etching the gate layer through the primary openings to form the gate openings.

15. A method as in claim 1 wherein the gate material comprises metal through which it is difficult to accurately etch small openings.

16. A method as in claim 1 wherein the gate material comprises gold.

17. A method comprising the steps of:

distributing a multiplicity of particles over an electrically insulating layer;

providing electrically non-insulating gate material over the insulating layer at least in space between the particles;

providing primary material over the gate material at least in space between the particles;

removing the particles and substantially any material overlying the particles such that the remaining primary material comprises a primary layer through which a like multiplicity of primary openings extend at the locations of the so-removed particles and such that the remaining gate material comprises a gate layer through which a like multiplicity of gate openings extend at locations respectively aligned vertically to the primary openings;

etching the insulating layer through the gate openings to form corresponding dielectric openings substantially through the insulating layer down to an underlying lower electrically non-insulating region; and forming a like multiplicity of electron-emissive elements over the lower non-insulating region such that each electron-emissive element is at least partially situated in a corresponding one of the dielectric openings.

18. A method as in claim 17 wherein the particles are largely spherical.

19. A method as in claim 17 wherein the forming step comprises forming the electron-emissive elements generally in the shape of cones.

20. A method as in claim 17 wherein the forming step comprises:

depositing electrically non-insulating emitter material over the primary layer and into the dielectric openings to form at least part of each electron-emissive element; and removing the primary layer so as to substantially remove any of the emitter material accumulated over the primary layer.

21. A method as in claim 20 wherein the depositing step entails depositing the emitter material under conditions that enable the emitter material to accumulate in the dielectric openings generally in the shape of cones that respectively form the electron-emissive elements.

22. A method as in claim 17 wherein each gate opening is of greater maximum diameter than the corresponding electron-emissive element.

23. A method as in claim 17 wherein the forming step comprises forming the electron-emissive elements generally in the shape of filaments.

24. A method as in claim 17 wherein the gate material comprises metal through which it is difficult to accurately etch small openings.

25. A method as in claim 17 wherein the gate material comprises gold.

26. A method comprising the steps of:

providing a structure in which an electrically non-insulating gate layer overlies an electrically insulating layer above a lower electrically non-insulating region;

distributing a multiplicity of particles over the gate layer;

providing primary material over the gate layer at least in space between the particles;

removing the particles and substantially any material overlying the particles such that the remaining primary material comprises a primary layer through which a like multiplicity of primary openings extend at the locations of the so-removed particles;

etching the gate layer through the primary openings to form corresponding gate openings through the gate layer;

etching the insulating layer through the gate openings to form corresponding dielectric openings substantially through the insulating layer;

depositing electrically non-insulating emitter material over the primary layer and into the dielectric openings to form corresponding electron-emissive elements over the lower non-insulating region; and removing the primary layer so as to substantially remove any of the emitter material accumulated over the primary layer.

27. A method as in claim 26 wherein the particles are largely spherical.

28. A method as in claim 26 wherein each gate opening is of larger diameter than the corresponding primary opening.

29. A method as in claim 26 wherein the depositing step entails depositing the emitter material under conditions that enable the emitter material to accumulate in the dielectric openings generally in the shape of cones that respectively form the electron-emissive elements.

30. A method comprising the steps of:

distributing a multiplicity of particles over a primary layer;

providing further material over the primary layer at least in space between the particles;

removing the particles and substantially any material overlying the particles such that apertures extend through the remaining further material at the locations of the so-removed particles;

etching the primary layer through the apertures to form corresponding primary openings through the primary layer down to an underlying electrically non-insulating gate layer;

etching the gate layer through the primary openings to form corresponding gate openings through the gate layer down to an underlying electrically insulating layer;

etching the insulating layer through the gate openings to form corresponding dielectric openings substantially through the insulating layer down to an underlying lower electrically non-insulating region; and forming a like multiplicity of electron-emissive elements over the lower non-insulating region such that each electron-emissive element is at least partially situated in a corresponding one of the dielectric openings.

31. A method as in claim 30 wherein the particles are largely spherical.

32. A method as in claim 30 wherein the forming step comprises forming the electron-emissive elements generally in the shape of cones.

33. A method as in claim 30 wherein the forming step comprises;

depositing electrically non-insulating emitter material over the primary layer and into the dielectric openings to form at least part of each electron-emissive element; and removing the primary layer so as to substantially remove any of the emitter material accumulated over the primary layer.

34. A method as in claim 33 wherein the depositing step entails depositing the emitter material under conditions that enable the emitter material to accumulate in the dielectric openings generally in the shape of cones that respectively form the electron-emissive elements.

35. A method as in claim 30 further including, between the particle-removing and forming steps, the step of removing the further layer.

36. A method as in claim 35 wherein the further layer comprises metal.

37. A method as in claim 30 wherein each gate opening is of greater maximum diameter than the corresponding electron-emissive element.

38. A method as in claim 30 wherein the forming step comprises forming the electron-emissive elements generally in the shape of filaments.

* * * * *